(12) United States Patent
Lai et al.

(10) Patent No.: US 10,497,565 B2
(45) Date of Patent: Dec. 3, 2019

(54) METHOD FOR FORMING SEMICONDUCTOR DEVICE STRUCTURE

(71) Applicant: Taiwan Semiconductor Manufacturing Co., Ltd., Hsinchu (TW)

(72) Inventors: Chih-Ming Lai, Hsinchu (TW); Shih-Ming Chang, Zhubei (TW); Wei-Liang Lin, Hsinchu (TW); Chin-Yuan Tseng, Taipei (TW); Ru-Gun Liu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/149,577

(22) Filed: Oct. 2, 2018

(65) Prior Publication Data

US 2019/0157085 A1    May 23, 2019

Related U.S. Application Data

(60) Provisional application No. 62/589,004, filed on Nov. 21, 2017.

(51) Int. Cl.
*H01L 21/311* (2006.01)
*H01L 21/033* (2006.01)

(52) U.S. Cl.
CPC ...... *H01L 21/0337* (2013.01); *H01L 21/0332* (2013.01); *H01L 21/31111* (2013.01); *H01L 21/31116* (2013.01)

(58) Field of Classification Search
None
See application file for complete search history.

(56) References Cited

U.S. PATENT DOCUMENTS

| 9,881,794 B1* | 1/2018 | Su | H01L 21/0332 |
| 2013/0234301 A1* | 9/2013 | Wang | H01L 21/0337 |
| | | | 257/635 |
| 2015/0111362 A1* | 4/2015 | Shieh | H01L 21/823431 |
| | | | 438/424 |
| 2017/0200798 A1* | 7/2017 | Chen | H01L 21/823456 |

* cited by examiner

*Primary Examiner* — Shamim Ahmed
(74) *Attorney, Agent, or Firm* — McClure, Qualey & Rodack, LLP

(57) ABSTRACT

A method for forming a semiconductor device structure is provided. The method includes forming a first layer over a substrate. The first layer has a trench. The method includes forming first spacers over inner walls of the trench. The method includes removing a portion of the first spacers. The method includes forming a filling layer into the trench to cover the first spacers. The filling layer and the first spacers together form a strip structure. The method includes removing the first layer. The method includes forming second spacers over two opposite first sidewalls of the strip structure. The method includes forming third spacers over second sidewalls of the second spacers. The method includes removing the filling layer and the second spacers.

20 Claims, 39 Drawing Sheets

METHOD FOR FORMING SEMICONDUCTOR DEVICE STRUCTURE

PRIORITY CLAIM AND CROSS-REFERENCE

This Application claims the benefit of U.S. Provisional Application No. 62/589,004, filed on Nov. 21, 2017, and entitled "METHOD FOR FORMING SEMICONDUCTOR DEVICE STRUCTURE", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1 to 1O-1 are cross-sectional views illustrating the semiconductor device structure along sectional lines I-I' in FIGS. 1A-1O, in accordance with some embodiments.

FIGS. 1A-2 to 1O-2 are cross-sectional views illustrating the semiconductor device structure along sectional lines II-II' in FIGS. 1A-1O, in accordance with some embodiments.

FIGS. 3A-1 to 3F-1 are cross-sectional views illustrating the semiconductor device structure along sectional lines I-I' in FIGS. 3A-3F, in accordance with some embodiments.

FIGS. 3A-2 to 3F-2 are cross-sectional views illustrating the semiconductor device structure along sectional lines II-II' in FIGS. 3A-3F, in accordance with some embodiments.

DETAILED DESCRIPTION

Figure 1A:
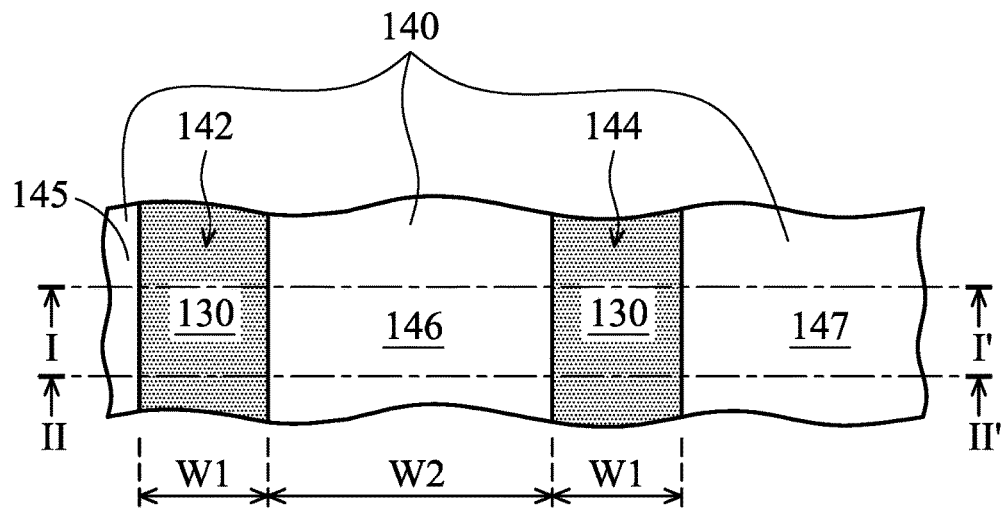
FIGS. 1A-1O are top views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A:
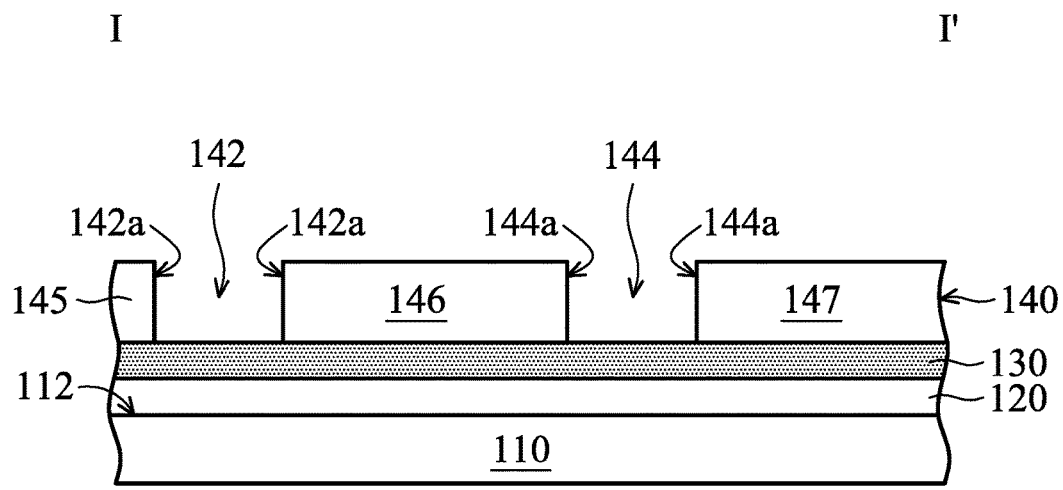
Figures 1, 1A, 2:
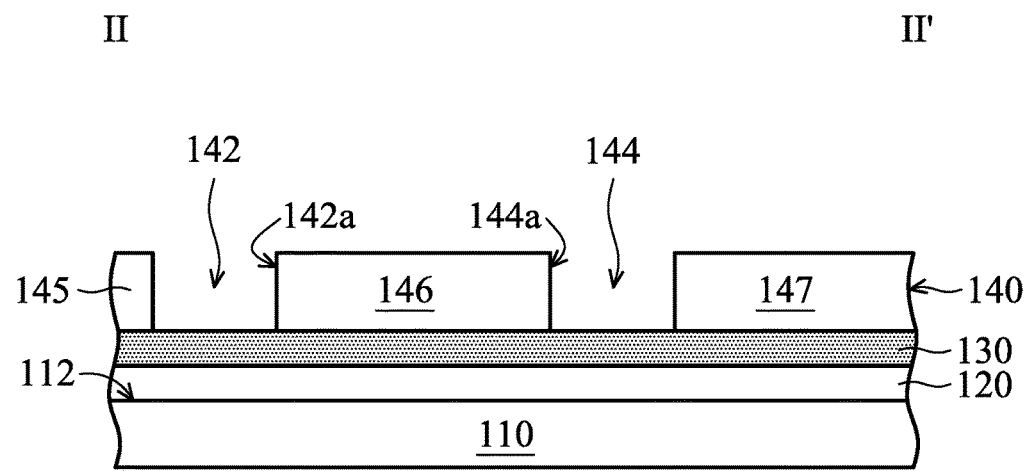
Figure 1B:
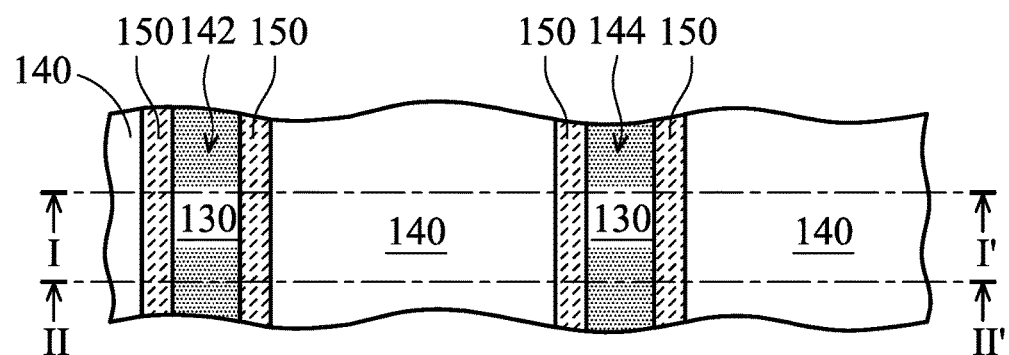
Figures 1, 1B:
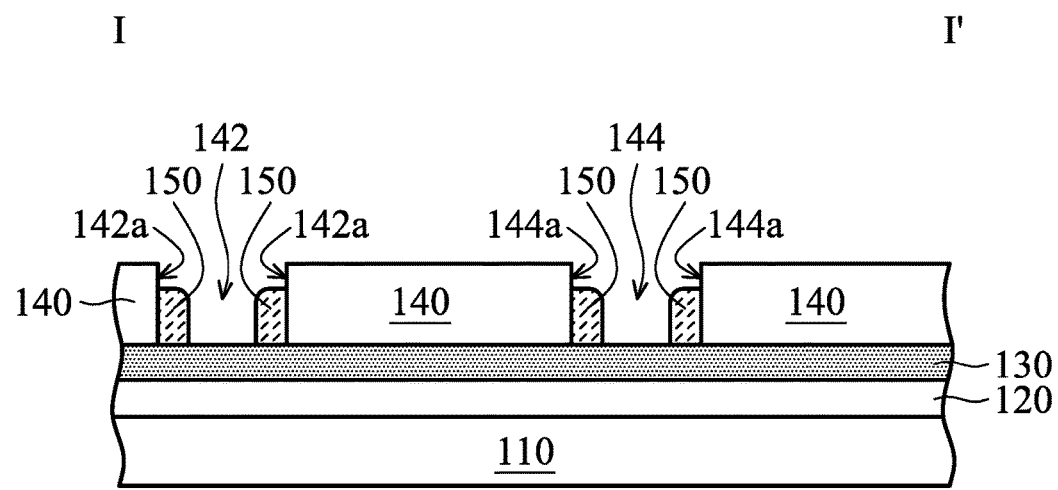
Figures 1, 1B, 2:
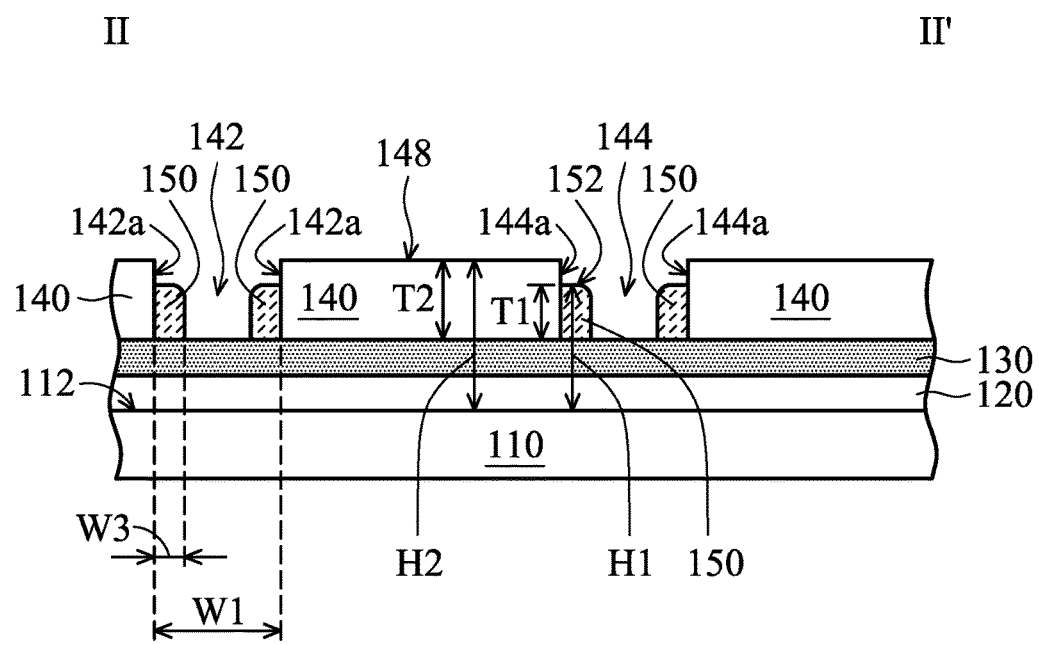
Figure 1C:
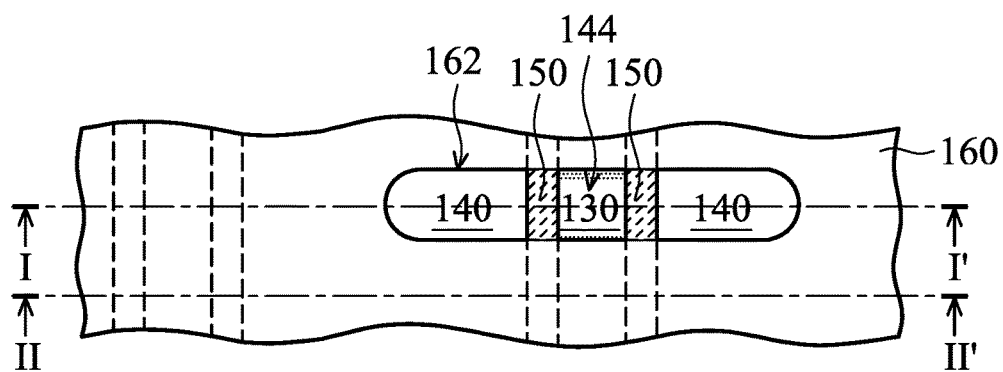
Figures 1, 1C:
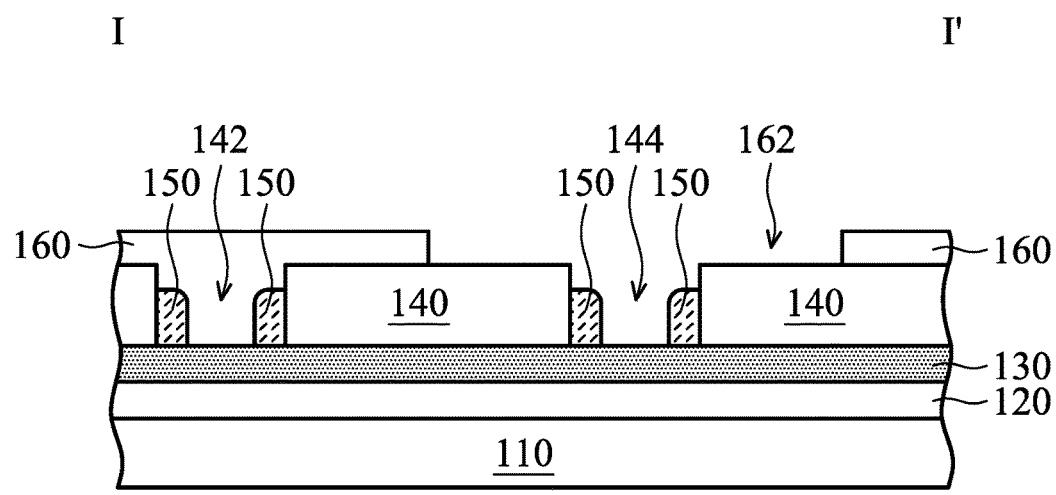
Figures 1, 1C, 2:
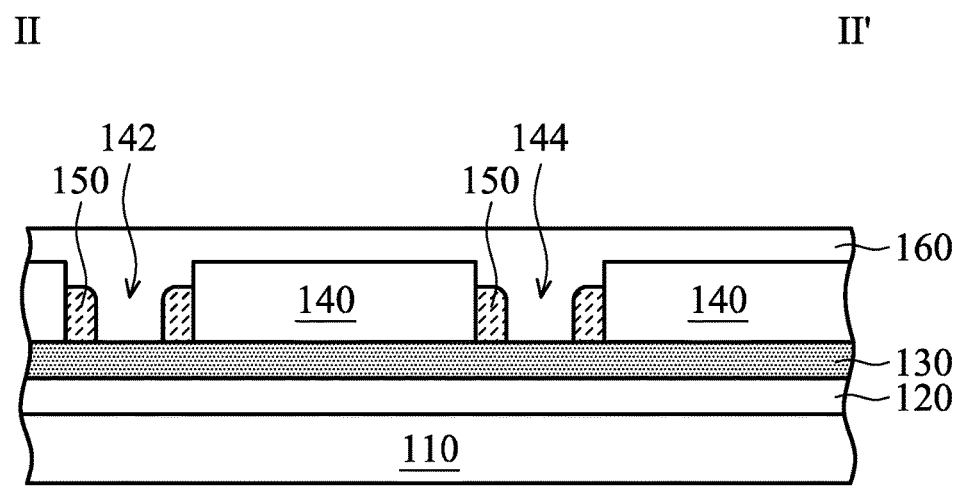
Figure 1D:
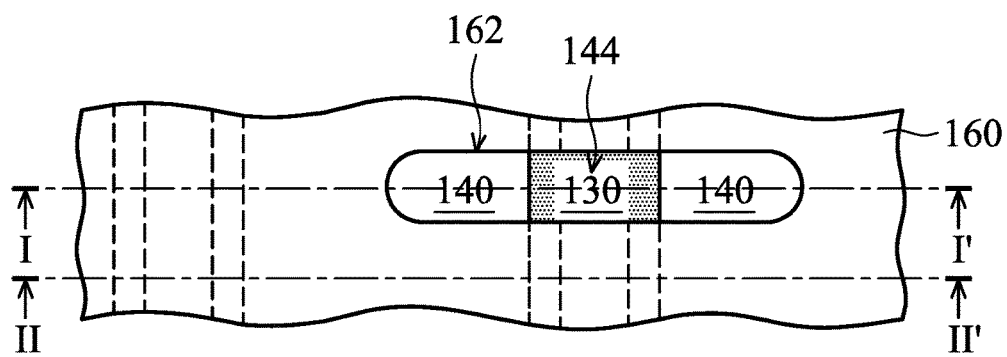
Figures 1, 1D:
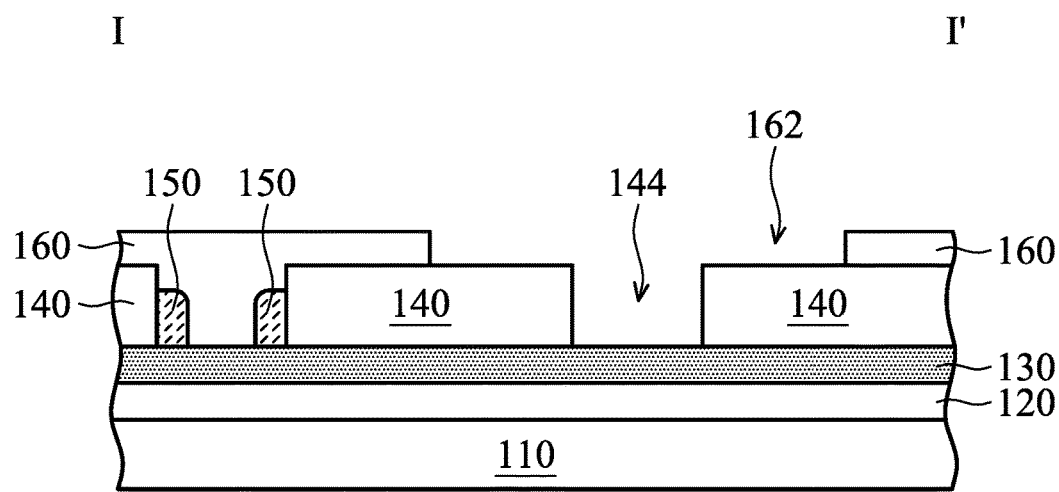
Figures 1, 1D, 2:
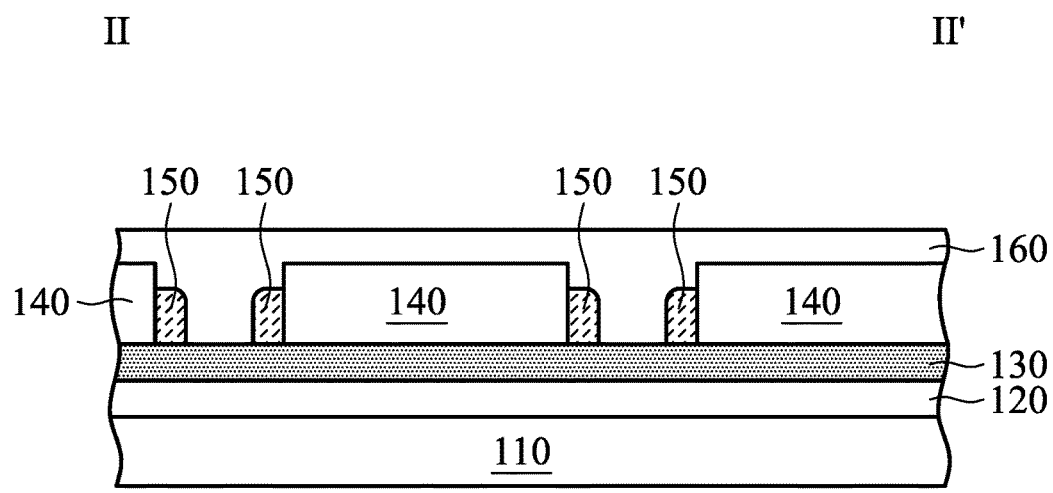
Figure 1E:
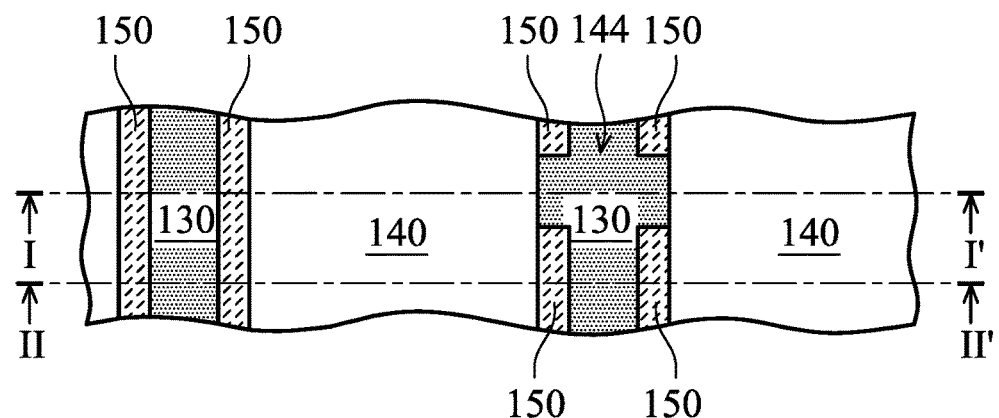
Figures 1, 1E:
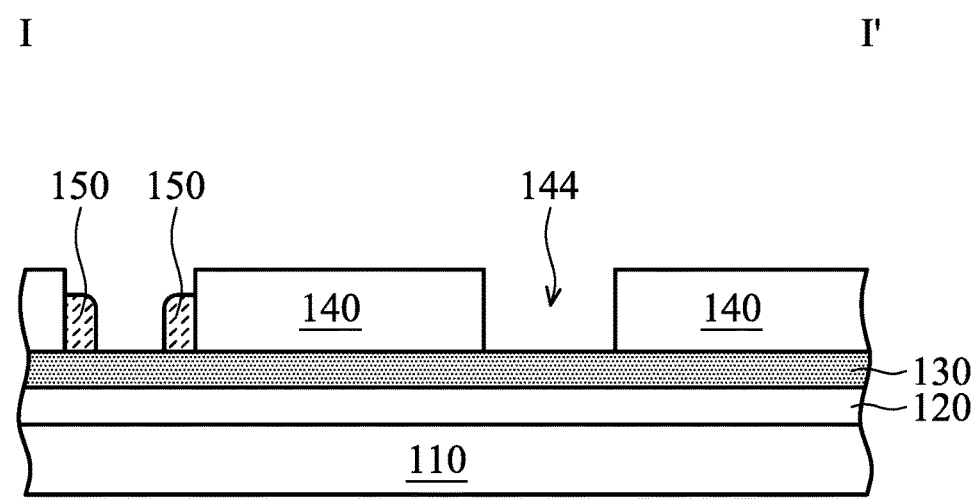
Figures 1, 1E, 2:
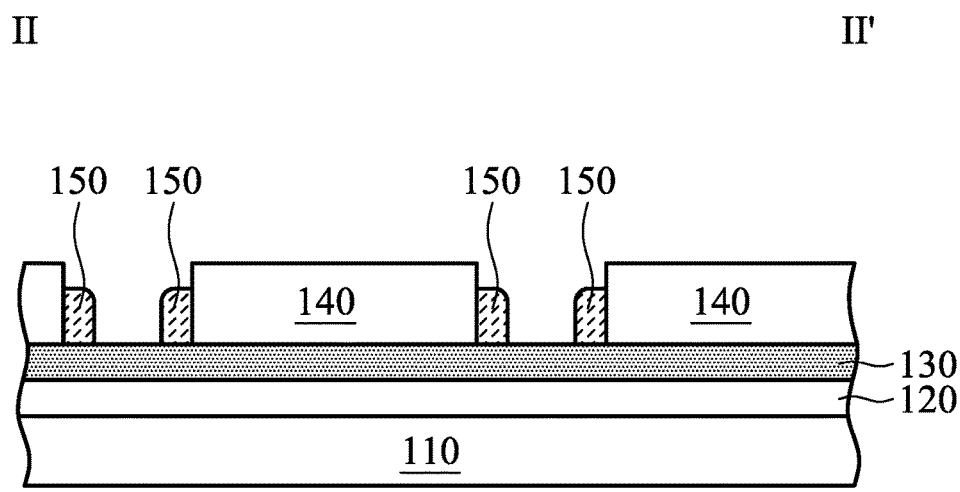
Figure 1F:
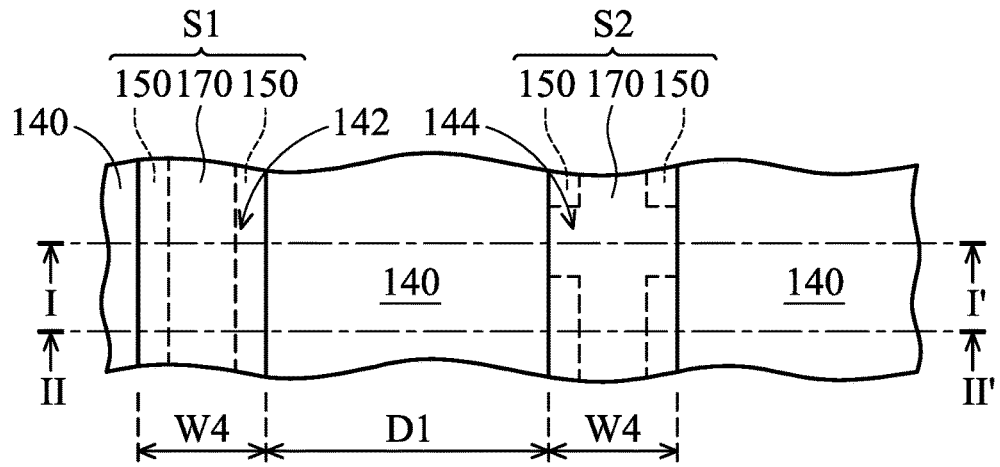
Figures 1, 1F:
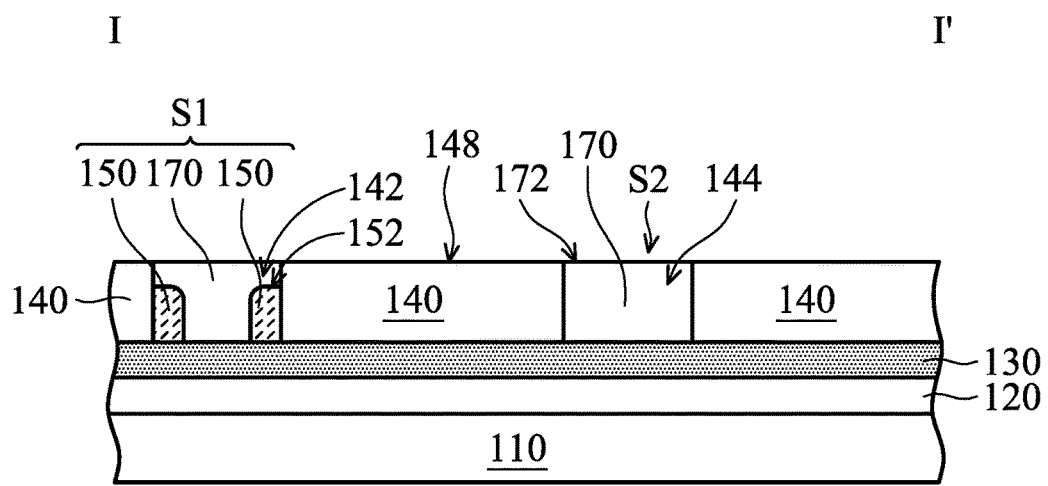
Figures 1, 1F, 2:
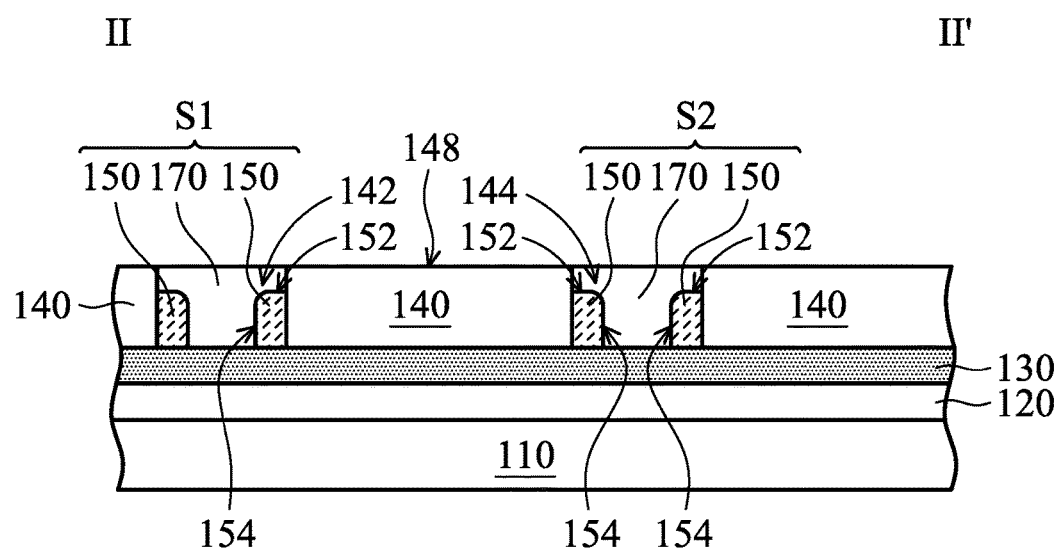
Figure 1G:
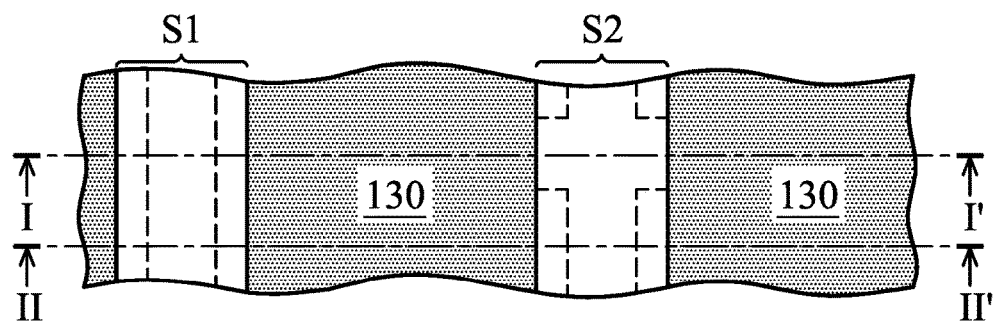
Figures 1, 1G:
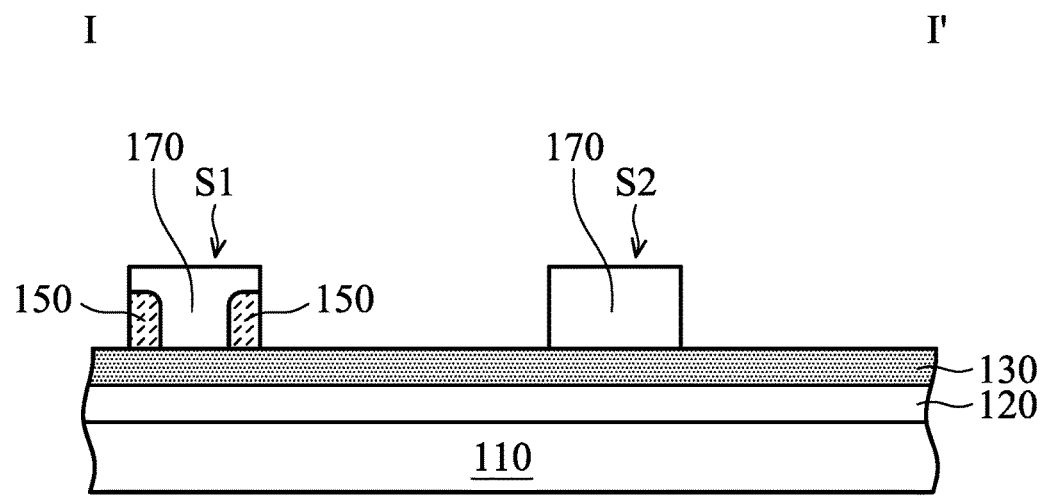
Figures 1, 1G, 2:
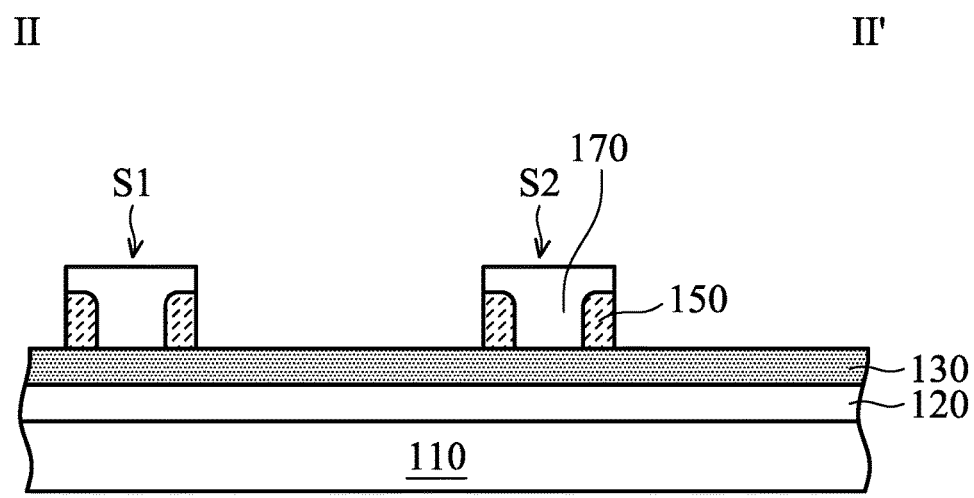
Figure 1H:
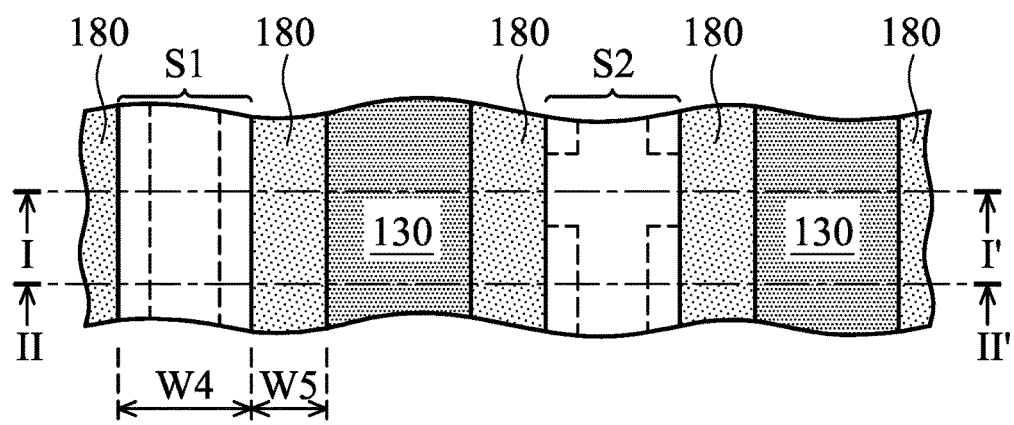
Figures 1, 1H:
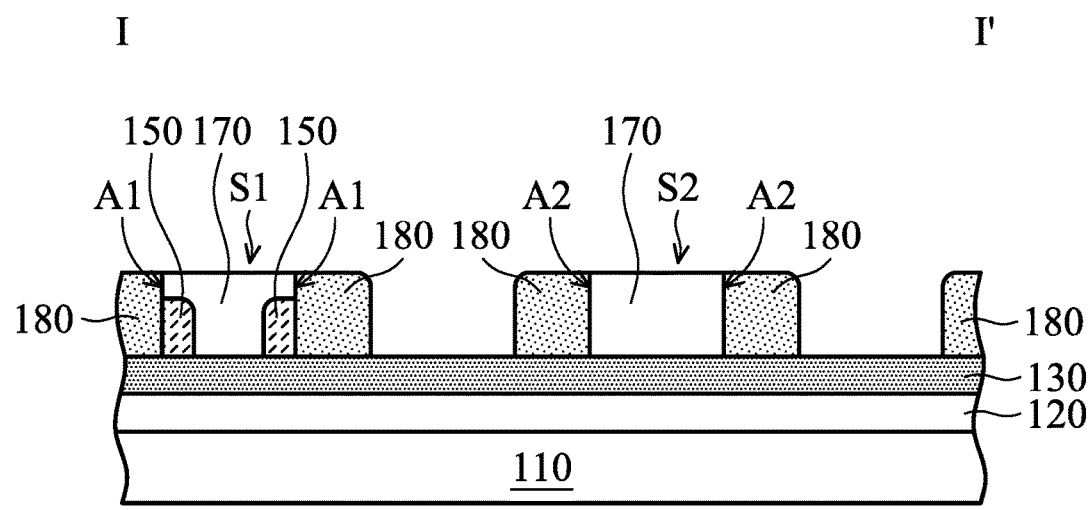
Figures 1, 1H, 2:
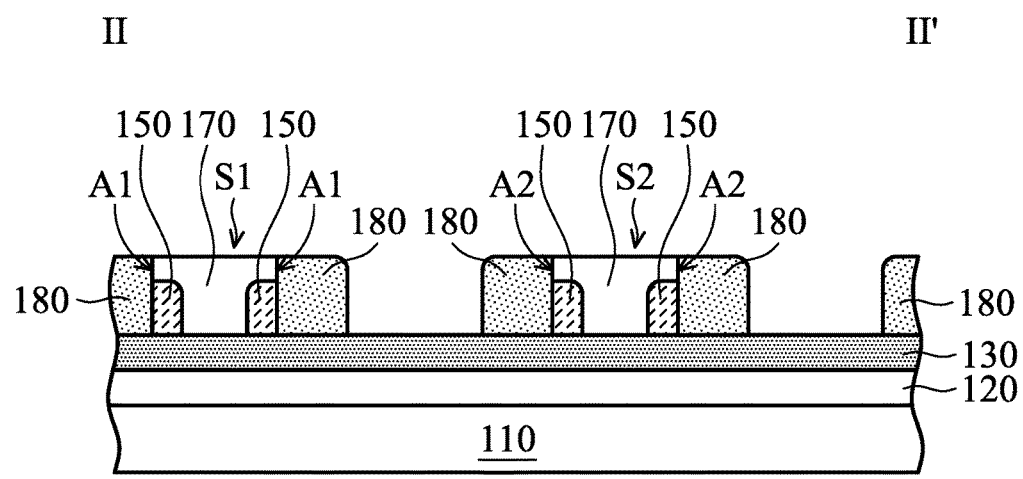
Figure 1I:
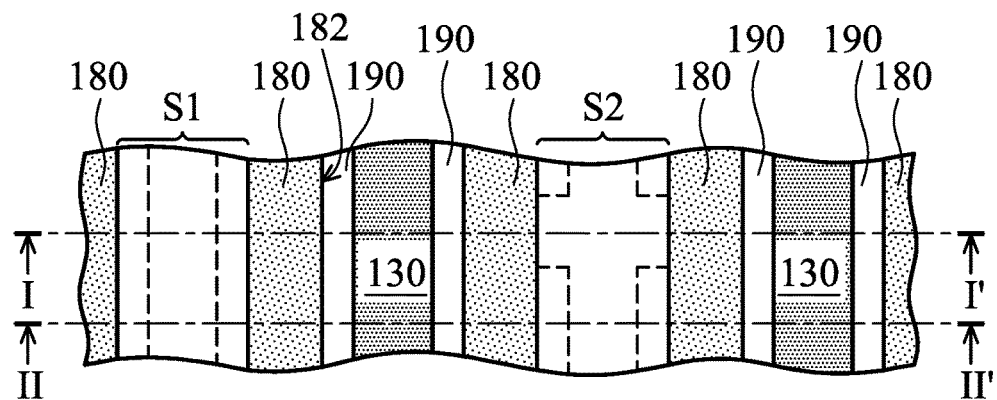
Figures 1, 1I:
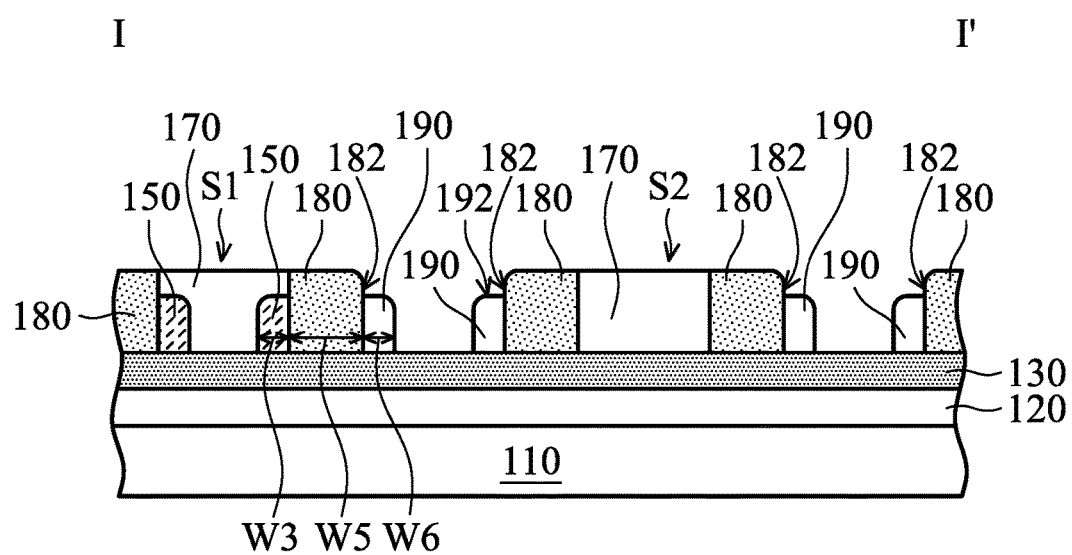
Figures 1, 1I, 2:
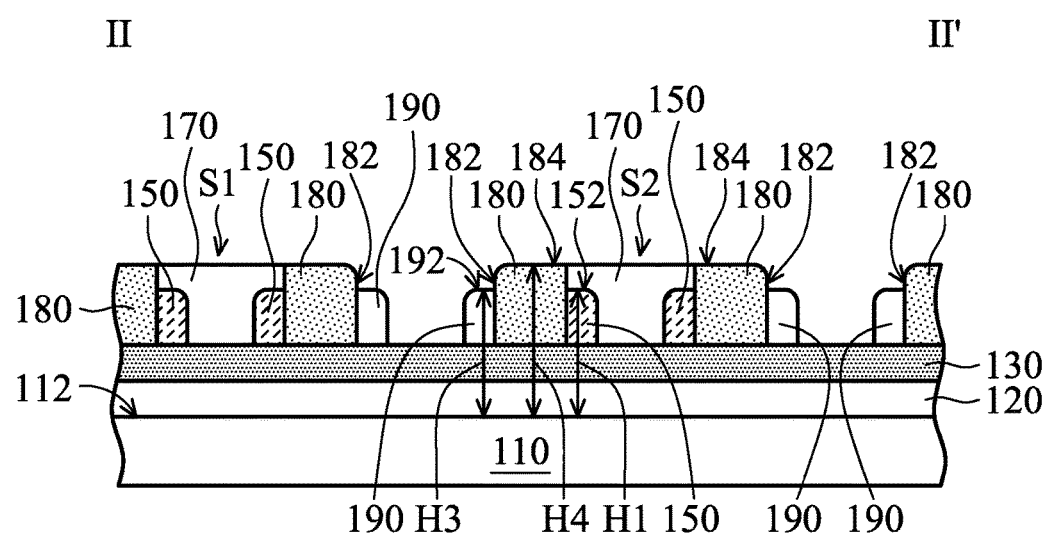
Figure 1J:
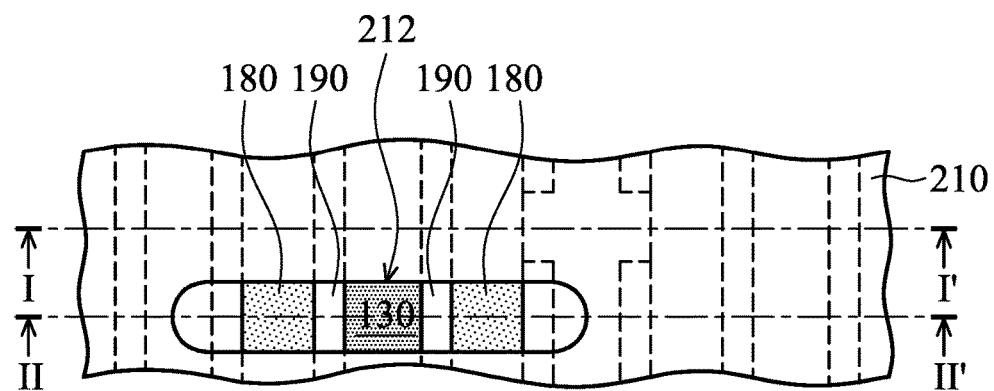
Figures 1, 1J:
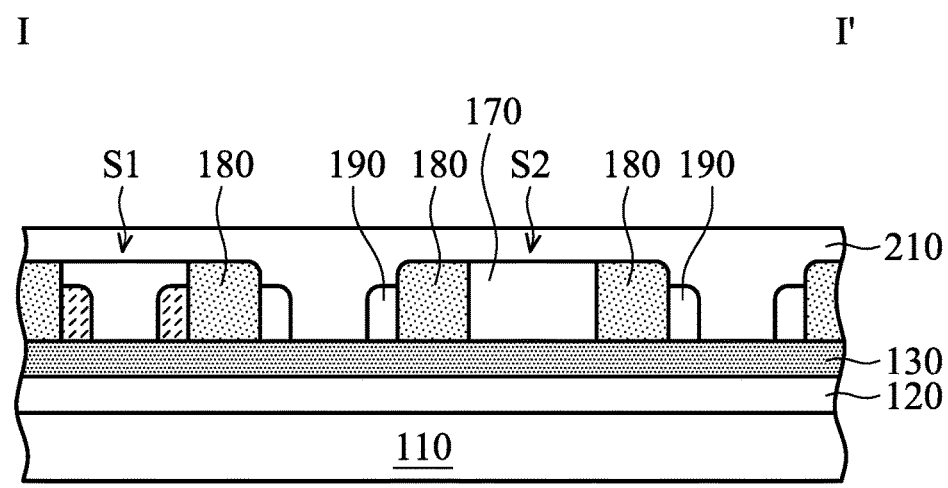
Figures 1, 1J, 2:
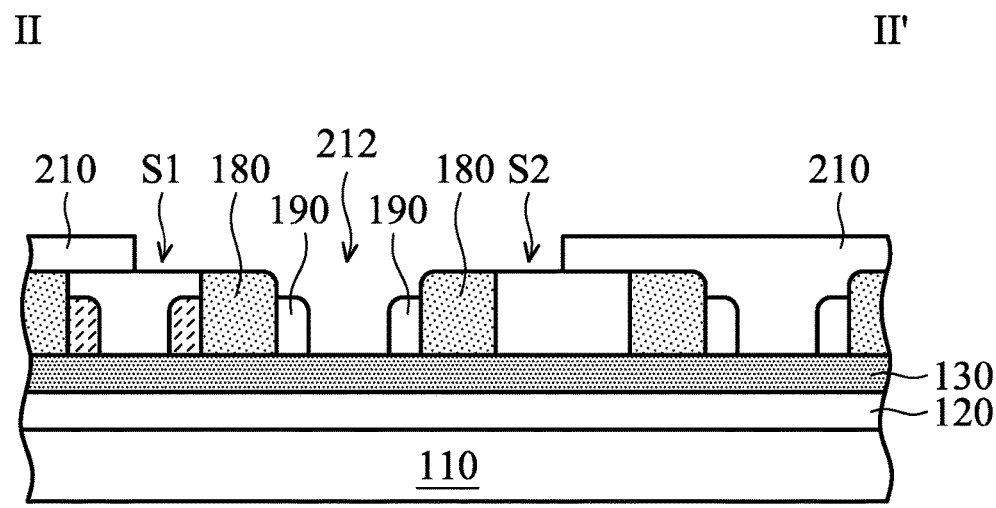
Figure 1K:
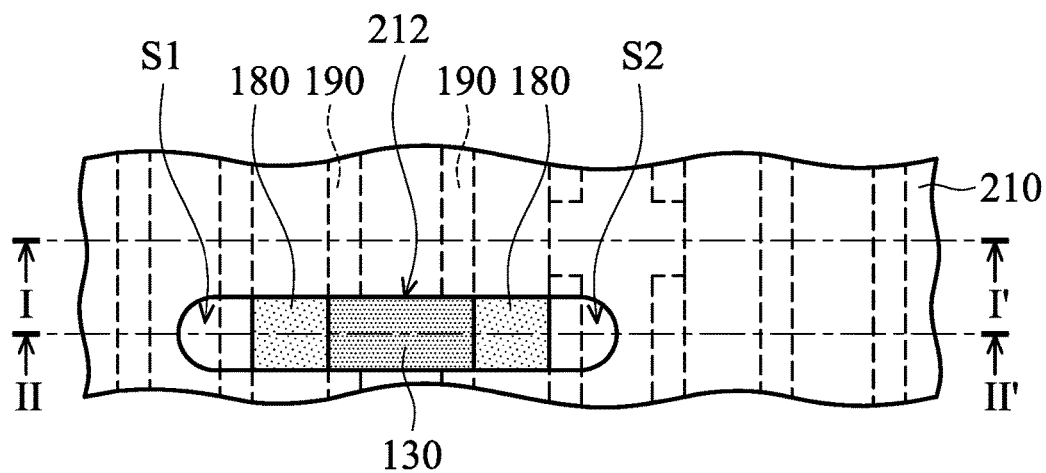
Figures 1, 1K:
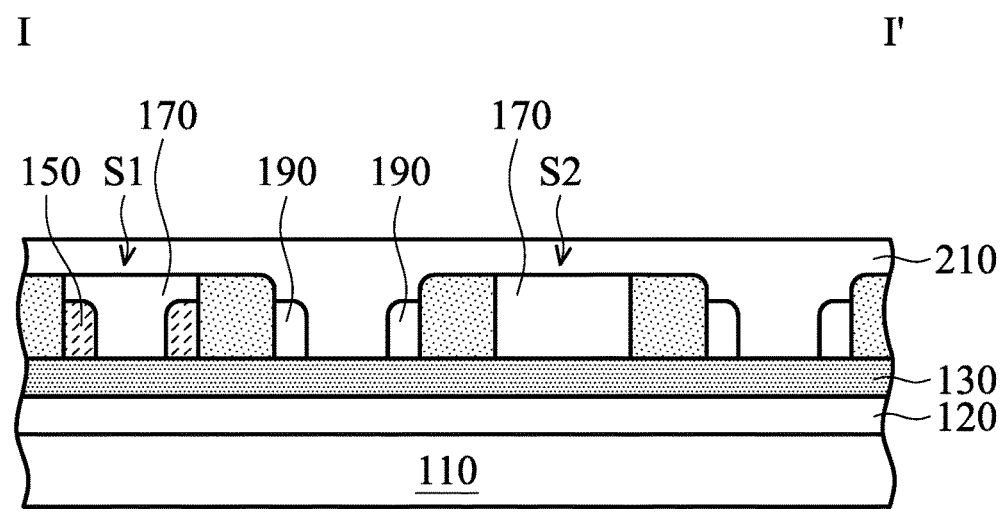
Figures 1, 1K, 2:
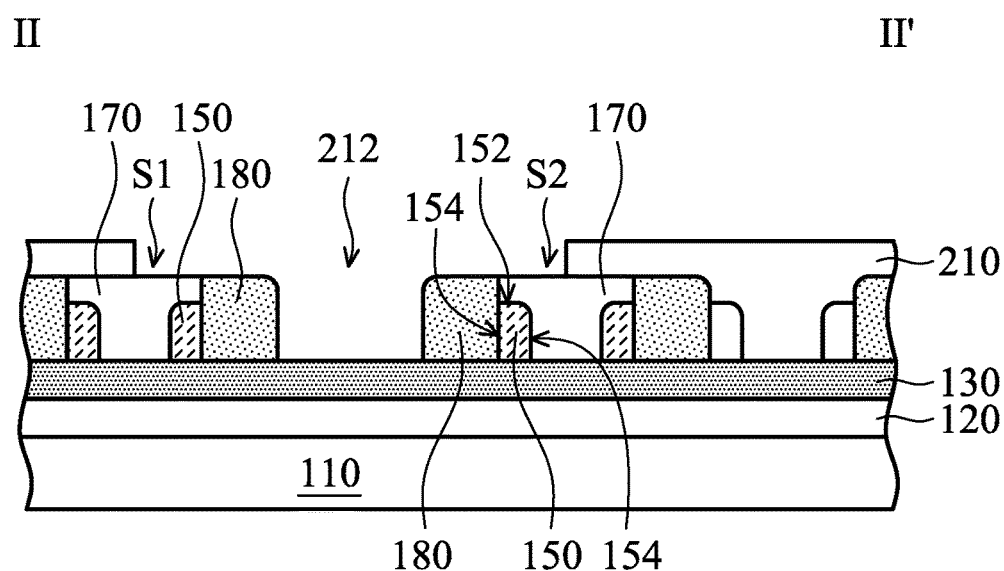
Figure 1L:
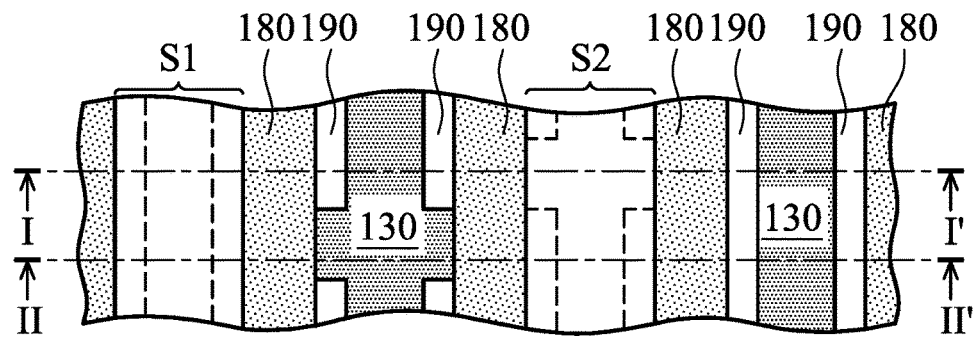
Figures 1, 1L:
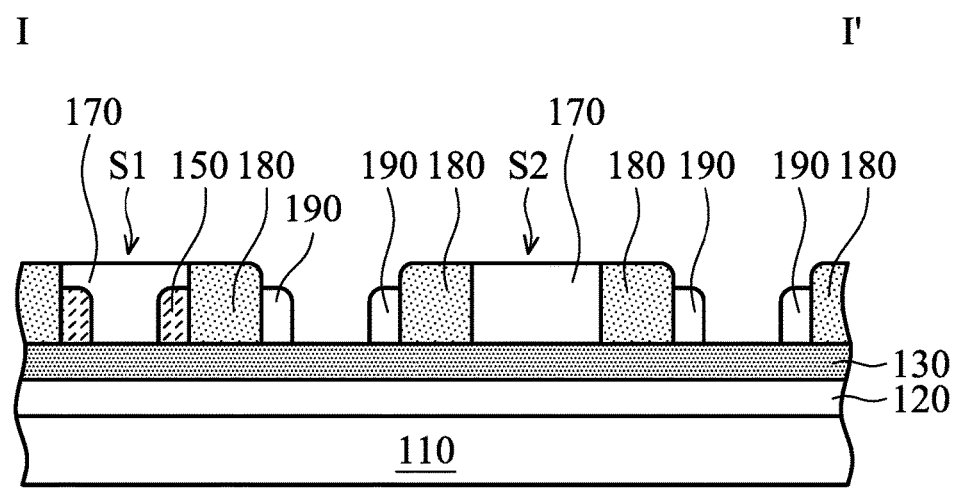
Figures 1, 1L, 2:
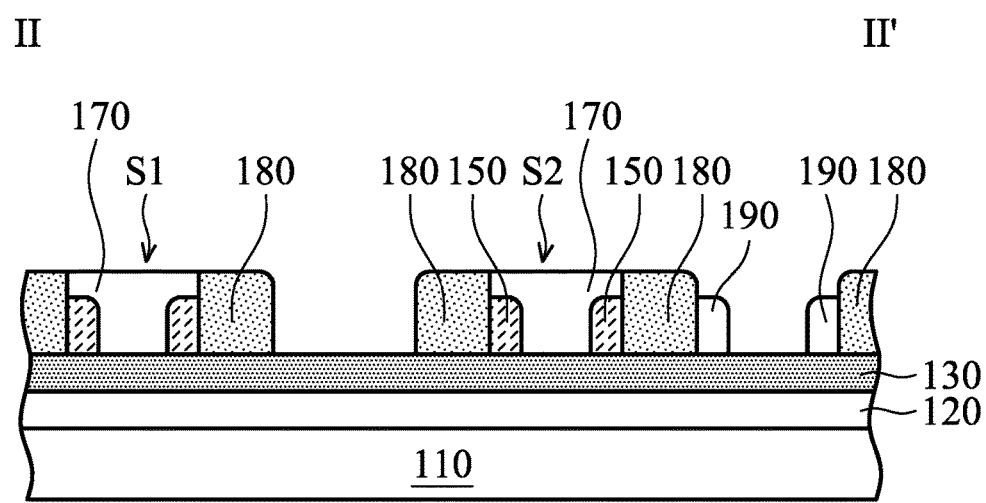
Figure 1M:
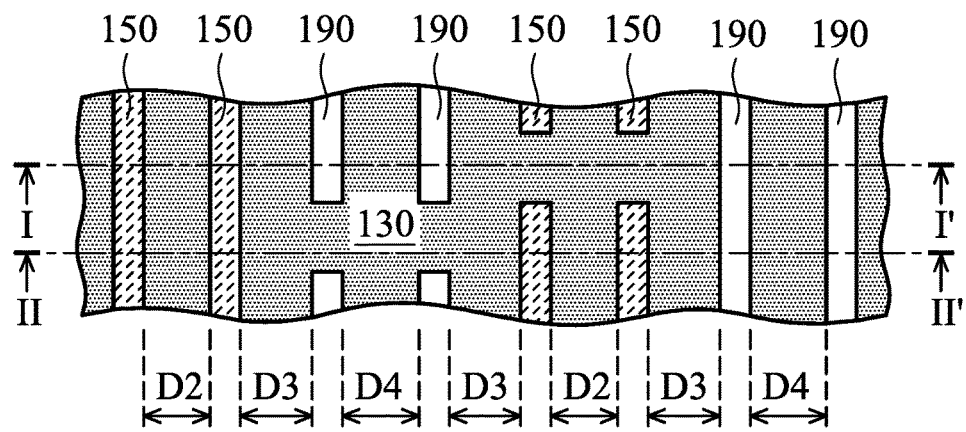
Figures 1, 1M:
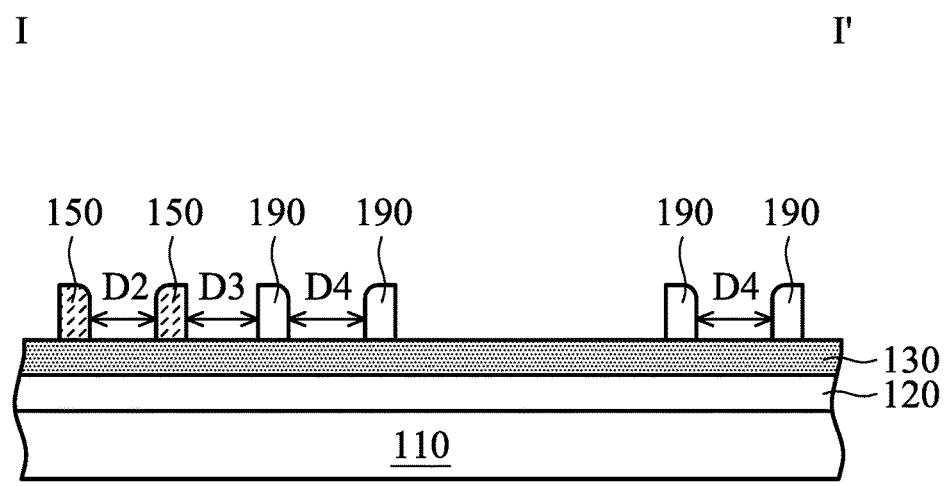
Figures 1, 1M, 2:
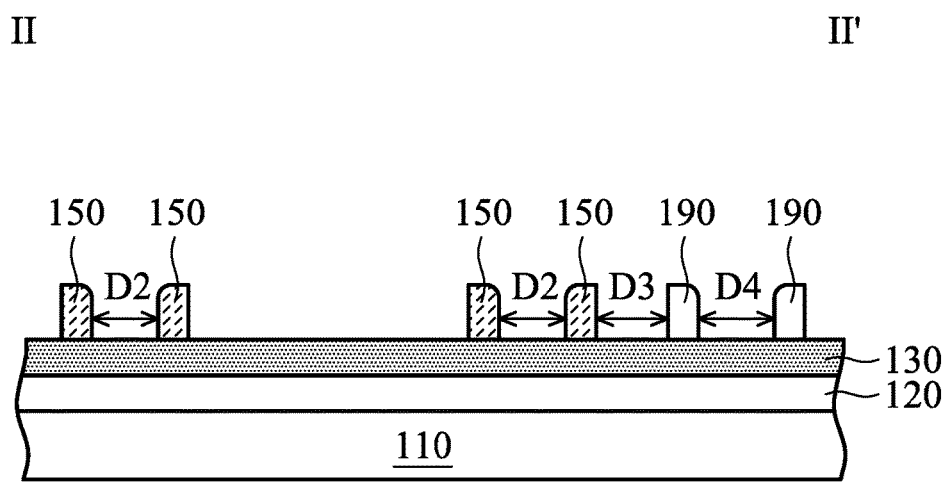
Figure 1N:
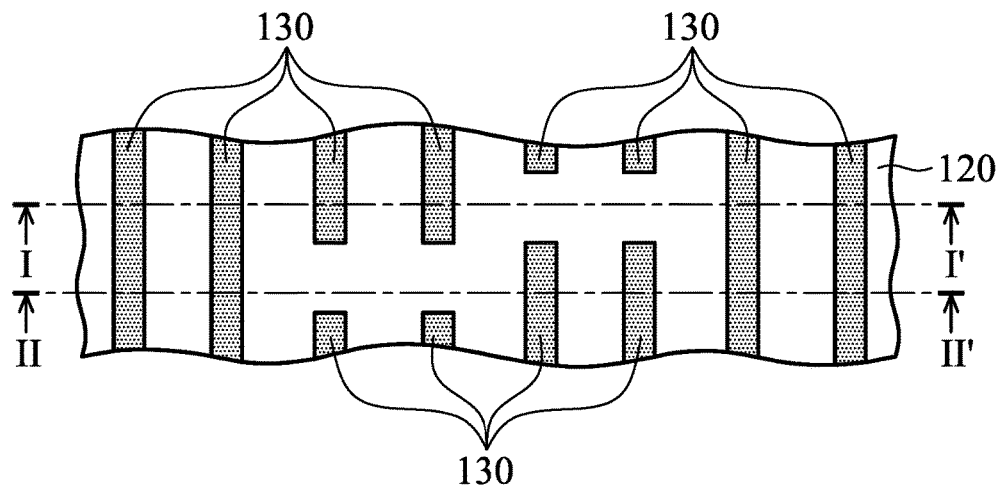
Figures 1, 1N:
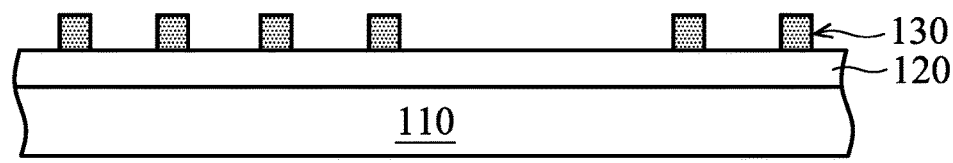
Figures 1, 1N, 2:
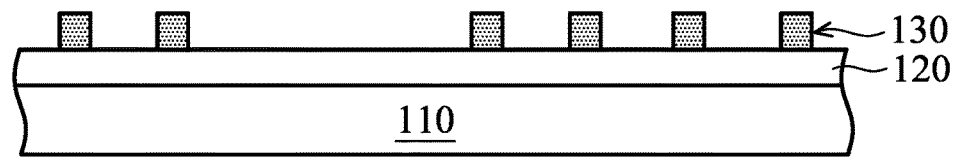
Figure 1O:
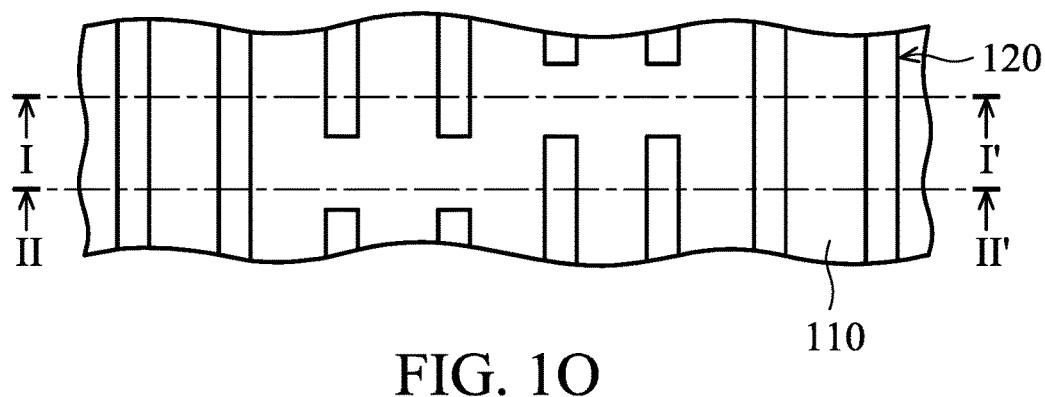
Figures 1, 1O:
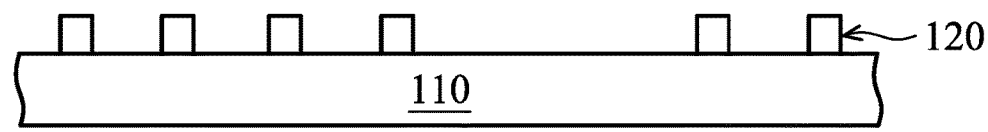
Figures 1, 1O, 2:
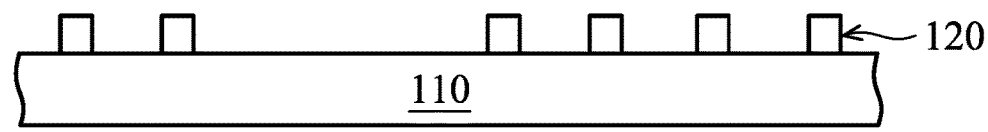

FIGS. 1A-1O are top views of various stages of a process for forming a semiconductor device structure, in accordance with some embodiments. FIGS. 1A-1 to 1O-1 are cross-sectional views illustrating the semiconductor device structure along sectional lines I-I' in FIGS. 1A-1O, in accordance with some embodiments. FIGS. 1A-2 to 1O-2 are cross-sectional views illustrating the semiconductor device structure along sectional lines II-II' in FIGS. 1A-1O, in accordance with some embodiments.

As shown in FIGS. 1A, 1A-1, and 1A-2, a substrate 110 is provided, in accordance with some embodiments. The substrate 110 has a surface 112, in accordance with some embodiments. In some embodiments, the substrate 110 is a bulk semiconductor substrate, such as a semiconductor wafer. For example, the substrate 110 is a silicon wafer.

The substrate 110 may include silicon or another elementary semiconductor material such as germanium. In some other embodiments, the substrate 110 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 110 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the substrate 110. The device elements are not shown in figures for the purpose of simplicity and clarity. Examples of the various device elements include transistors, diodes, another suitable element, or a combination thereof.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A, 1A-1, and 1A-2, a layer 120 is formed over the surface 112 of the substrate 110, in accordance with some embodiments. The layer 120 is a single-layer structure or a multi-layer structure, in accordance with some embodiments. The layer 120 is made of an insulating material, in accordance with some embodiments.

The insulating material includes silicon nitride, silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof. The layer 120 is formed using a chemical vapor deposition process, a spin coating process, or another suitable process.

In some other embodiments, the layer 120 is made of a conductive material, in accordance with some embodiments. The conductive material includes metal, such as copper, aluminum, tungsten, gold, silver, or a combination thereof, in accordance with some embodiments. The layer 120 is formed using a physical vapor deposition process, a plating process, or another suitable process.

As shown in FIGS. 1A, 1A-1, and 1A-2, a layer 130 is formed over the layer 120, in accordance with some embodiments. The layer 130 is a single-layer structure or a multi-layer structure, in accordance with some embodiments. The layer 130 is made of an insulating material, in accordance with some embodiments. The insulating material includes metal oxide, such as hafnium oxide.

The insulating material includes silicon oxide, silicon nitride, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof. The layer 130 is formed using a physical vapor deposition process, a chemical vapor deposition process, a spin coating process, or another suitable process.

In some other embodiments, the layer 130 is made of a conductive material, in accordance with some embodiments. The conductive material includes metal, such as copper, aluminum, tungsten, gold, silver, or a combination thereof, in accordance with some embodiments. The layer 130 is formed using a physical vapor deposition process, a plating process, or another suitable process. The layers 120 and 130 are made of different materials, in accordance with some embodiments.

As shown in FIGS. 1A, 1A-1, and 1A-2, a layer 140 is formed over the layer 130, in accordance with some embodiments. The layer 140 has trenches 142 and 144, in accordance with some embodiments. The trenches 142 and 144 pass through the layer 140, in accordance with some embodiments. The trenches 142 and 144 are spaced apart from each other, in accordance with some embodiments. The trenches 142 and 144 have inner walls 142a and 144a, in accordance with some embodiments. As shown in FIG. 1A, the trenches 142 and 144 are parallel to each other, in accordance with some embodiments.

The trenches 142 and 144 have substantially the same width W1, in accordance with some embodiments. The term "substantially the same" in the application means "within 10%", in accordance with some embodiments. For example, the term "substantially the same" means the difference between the widths of the trenches 142 and 144 is within 10% of the average width of the trenches 142 and 144, in accordance with some embodiments. The difference may be due to manufacturing processes.

The layer 140 is divided into strip portions 145, 146, and 147 by the trenches 142 and 144, in accordance with some embodiments. As shown in FIG. 1A, the strip portions 145, 146, and 147 are substantially parallel to each other, in accordance with some embodiments. The strip portions 145, 146, and 147 have substantially the same width W2, in accordance with some embodiments. The width W2 is greater than the width W1, in accordance with some embodiments.

The layers 130 and 140 are made of different materials, in accordance with some embodiments. The layer 140 is made of a semiconductor material, an insulating material, or a conductive material, in accordance with some embodiments. The semiconductor material includes silicon, such as amorphous silicon, in accordance with some embodiments.

The insulating material includes silicon oxide, silicon nitride, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof.

The conductive material includes metal, such as copper, aluminum, tungsten, gold, silver, or a combination thereof, in accordance with some embodiments. The layer 140 is formed using a physical vapor deposition process, a chemical vapor deposition process, a plating process, or another suitable process.

As shown in FIGS. 1B, 1B-1, and 1B-2, spacers 150 are formed over the inner walls 142a and 144a of the trenches 142 and 144, in accordance with some embodiments. Each spacer 150 has a top surface 152, in accordance with some embodiments. The layer 140 has a top surface 148, in accordance with some embodiments. The top surface 152 is lower than the top surface 148, in accordance with some embodiments. That is, a maximum height H1 of the top surface 152 relative to the surface 112 is less than a maximum height H2 of the top surface 148 relative to the surface 112, in accordance with some embodiments.

Each spacer 150 has a thickness T1, in accordance with some embodiments. The layer 140 has a thickness T2, in accordance with some embodiments. The thickness T1 is less than the thickness T2, in accordance with some embodiments. In some embodiments, a ratio of the thickness T1 to the thickness T2 ranges from about 0.5 to about 0.95. In some embodiments, the ratio of the thickness T1 to the thickness T2 ranges from about 0.7 to about 0.8. The entire spacers 150 are positioned in the trenches 142 and 144, in accordance with some embodiments.

The spacers 150 and the layers 130 and 140 are made of different materials, in accordance with some embodiments. The spacers 150 are made of an insulating material or a conductive material, in accordance with some embodiments. The insulating material includes silicon nitride, silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof.

The conductive material includes metal, such as copper, aluminum, tungsten, gold, silver, or a combination thereof, in accordance with some embodiments. The spacers 150 are formed using a deposition process (e.g., a chemical vapor deposition process or a physical vapor deposition process) and an anisotropic etching process (e.g., a dry etching process), in accordance with some embodiments. The spacers 150 have substantially the same width W3, in accordance with some embodiments. The width W3 is less than the width W1 of the trench 142 or 144, in accordance with some embodiments. In some embodiments, a ratio of the width W3 to the width W1 ranges from about 0.125 to about 0.333.

As shown in FIGS. 1C, 1C-1, and 1C-2, a mask layer 160 is formed over the layers 130 and 140 and the spacers 150, in accordance with some embodiments. The mask layer 160 has an opening 162, in accordance with some embodiments. The opening 162 exposes portions of the spacers 150 in the trench 144, in accordance with some embodiments. The opening 162 further exposes portions of the layer 140, in accordance with some embodiments.

The mask layer 160 is made of a material that is different from the materials of the layers 130 and 140 and the spacers 150, in accordance with some embodiments. The mask layer 160 is made of a polymer material or another suitable material, in accordance with some embodiments. The mask layer 160 is formed using a spin coating process and a dry etching process (e.g., an oxygen plasma etching process), in accordance with some embodiments.

As shown in FIGS. 1D, 1D-1, and 1D-2, the portions of the spacers 150 exposed by the opening 162 are removed, in accordance with some embodiments. The removal process includes a dry etching process, such as a plasma etching process (e.g., a chlorine plasma etching process), in accordance with some embodiments.

As shown in FIGS. 1E, 1E-1, and 1E-2, the mask layer 160 is removed, in accordance with some embodiments. The removal process includes a dry etching process, such as a plasma etching process (e.g., an oxygen plasma etching process), in accordance with some embodiments.

As shown in FIGS. 1F, 1F-1, and 1F-2, a filling layer 170 is filled into the trenches 142 and 144 to cover the spacers 150, in accordance with some embodiments. The filling layer 170 covers the top surfaces 152 and the sidewalls 154 of the spacers 150, in accordance with some embodiments.

The filling layer 170 and the spacers 150 in the trench 142 together form a strip structure S1, in accordance with some embodiments. The filling layer 170 and the spacers 150 in the trench 144 together form a strip structure S2, in accordance with some embodiments. The strip structures S1 and S2 are used to help form spacers between the spacers 150 in the subsequent processes, in accordance with some embodiments.

The strip structures S1 and S2 have substantially the same width W4, in accordance with some embodiments. The width W4 is less than a distance D1 between the strip structures S1 and S2, in accordance with some embodiments. As shown in FIG. 1F, the strip structures S1 and S2 are parallel to each other, in accordance with some embodiments.

The filling layer 170 is made of a material that is different from the materials of the layers 130 and 140 and the spacers 150, in accordance with some embodiments. The filling layer 170 is made of an insulating material, in accordance with some embodiments. The insulating material includes silicon oxide, silicon nitride, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof. The filling layer 170 is formed using a spin coating process and a chemical mechanical polishing process, in accordance with some embodiments.

In some other embodiments, the filling layer 170 is made of a conductive material, in accordance with some embodiments. The conductive material includes metal, such as copper, aluminum, tungsten, gold, silver, or a combination thereof, in accordance with some embodiments. The filling layer 170 is formed using a deposition process and a chemical mechanical polishing process, in accordance with some embodiments.

In some embodiments, a top surface 172 of the filling layer 170 and the top surface 148 of the layer 140 are substantially coplanar. The term "substantially coplanar" in the application may include small deviations from coplanar geometries. The deviations may be due to manufacturing processes.

As shown in FIGS. 1G, 1G-1, and 1G-2, the layer 140 is removed, in accordance with some embodiments. The removal process includes an etching process, in accordance with some embodiments. The etching process includes a wet etching process using a $NH_4OH$ solution, in accordance with some embodiments.

As shown in FIGS. 1H, 1H-1, and 1H-2, spacers 180 are formed over two opposite sidewalls A1 of the strip structure S1 and two opposite sidewalls A2 of the strip structure S2, in accordance with some embodiments. FIGS. 1H, 1H-1, and 1H-2 show a portion of a spacer 180 (i.e., the rightest spacer 180) formed over a sidewall of a not shown strip structure.

The spacers 180 have substantially the same width W5, in accordance with some embodiments. The width W4 of the strip structure S1 or S2 is greater than the width W5, in accordance with some embodiments. The spacers 150 and 180, the filling layer 170 and the layer 130 are made of different materials, in accordance with some embodiments. The spacers 180 are made of a semiconductor material, such as a silicon material (e.g., an amorphous silicon material), in accordance with some embodiments.

In some other embodiments, the spacers 180 are made of an insulating material, in accordance with some embodiments. The insulating material includes silicon oxide, silicon nitride, silicon oxynitride, a low dielectric constant (low-k)

material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof.

In some embodiments, the spacers 180 are made of a conductive material, in accordance with some embodiments. The conductive material includes metal, such as copper, aluminum, tungsten, gold, silver, or a combination thereof, in accordance with some embodiments.

The spacers 180 is formed using a deposition process (e.g., a chemical vapor deposition process or a physical vapor deposition process) and an anisotropic etching process (e.g., a dry etching process), in accordance with some embodiments.

As shown in FIGS. 1I, 1I-1, and 1I-2, spacers 190 are formed over sidewalls 182 of the spacers 180, in accordance with some embodiments. The spacers 190 have substantially the same width W6, in accordance with some embodiments. The width W6 is substantially equal to the width W3 of the spacer 150, in accordance with some embodiments. The width W3 or W6 is less than the width W5 of the spacer 180, in accordance with some embodiments.

Each spacer 190 has a top surface 192, in accordance with some embodiments. Each spacer 180 has a top surface 184, in accordance with some embodiments. The top surface 192 is lower than the top surface 184, in accordance with some embodiments. That is, a maximum height H3 of the top surface 192 relative to the surface 112 (of the substrate 110) is less than a maximum height H4 of the top surface 184 relative to the surface 112, in accordance with some embodiments. The maximum height H1 of the top surface 152 (of the spacer 150) relative to the surface 112 is less than the maximum height H4, in accordance with some embodiments. The maximum heights H1 and H3 are substantially equal to each other, in accordance with some embodiments.

In some embodiments, the spacers 150 and 190 are made of the same first material. In some embodiments, the filling layer 170 is made of a second material, and the second material is different from the first material of the spacers 150 and 190. The first material includes silicon nitride, in accordance with some embodiments.

The spacers 190 are made of an insulating material or a conductive material, in accordance with some embodiments. The insulating material includes silicon nitride, silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof.

The conductive material includes metal, such as copper, aluminum, tungsten, gold, silver, or a combination thereof, in accordance with some embodiments. The spacers 190 are formed using a deposition process (e.g., a chemical vapor deposition process or a physical vapor deposition process) and an anisotropic etching process (e.g., a dry etching process), in accordance with some embodiments. In some other embodiments, the spacers 150 and 190 are made of different materials, and the filling layer 170 is made of a material that is different from the materials of the spacers 150 and 190.

Since the portions of the spacers 150 are removed (as shown in FIGS. 1D and 1D-1) first and then the spacers 190 are formed, the removal process of the portions of the spacers 150 does not damage the spacers 190, in accordance with some embodiments. Therefore, the process sequence (of the removal process of the portions of the spacers 150 and the formation of the spacers 190) may increase the acceptable width of the opening 162 of the mask layer 160 and may lower the required alignment accuracy between the opening 162 and the spacers 150. As a result, the process sequence may improve the yield of the removal process of the portions of the spacers 150 exposed by the opening 162.

As shown in FIGS. 1J, 1J-1, and 1J-2, a mask layer 210 is formed over the layer 130, the strip structures S1 and S2, and the spacers 180 and 190, in accordance with some embodiments. The mask layer 210 has an opening 212, in accordance with some embodiments. The opening 212 exposes portions of the spacers 190, in accordance with some embodiments. The opening 212 further exposes portions of the strip structures S1 and S2 and the spacers 180, in accordance with some embodiments.

The mask layer 210 is made of a material that is different from the materials of the layer 130, the strip structures S1 and S2, and the spacers 180 and 190, in accordance with some embodiments. The mask layer 210 is made of a polymer material or another suitable material, in accordance with some embodiments. The mask layer 210 is formed using a spin coating process and a dry etching process (e.g., an oxygen plasma etching process), in accordance with some embodiments.

As shown in FIGS. 1K, 1K-1, and 1K-2, the portions of the spacers 190 exposed by the opening 212 are removed, in accordance with some embodiments. The removal process includes a dry etching process, such as a plasma etching process (e.g., a chlorine plasma etching process), in accordance with some embodiments.

Since the filling layer 170 and the spacers 180 cover the top surfaces 152 and the sidewalls 154 of the spacers 150, the filling layer 170 and the spacers 180 protect the spacers 150 from damage during the removal process of the portions of the spacers 190 exposed by the opening 212. Therefore, the formation of the filling layer 170 and the spacers 180 may increase the acceptable width of the opening 212 and may lower the required alignment accuracy between the opening 212 and the spacers 190. As a result, the formation of the filling layer 170 and the spacers 180 may improve the yield of the removal process of the portions of the spacers 190 exposed by the opening 212.

As shown in FIGS. 1L, 1L-1, and 1L-2, the mask layer 210 is removed, in accordance with some embodiments. The removal process includes a dry etching process, such as a plasma etching process (e.g., an oxygen plasma etching process), in accordance with some embodiments.

As shown in FIGS. 1M, 1M-1, and 1M-2, the filling layer 170 and the spacers 180 are removed, in accordance with some embodiments. The filling layer 170 is removed using an etching process, such as a wet etching process using a NH$_4$OH solution, in accordance with some embodiments.

The spacers 180 are removed using an etching process, such as a wet etching process using a HF solution, in accordance with some embodiments. In some embodiments, the filling layer 170 is removed first, and then the spacers 180 are removed. In some other embodiments, the spacers 180 are removed first, and then the filling layer 170 is removed.

In some embodiments, two adjacent spacers 150 are spaced apart by a distance D2. The spacer 150 and 190 are spaced apart by a distance D3, in accordance with some embodiments. In some embodiments, two adjacent spacers 190 are spaced apart by a distance D4.

The distances D2, D3 and D4 are substantially equal to each other, in accordance with some embodiments. The term "substantially equal to" in the application means "within 10%", in accordance with some embodiments. For example, the term "substantially equal to" means the difference between the distances D2, D3 and D4 is within 10% of the average distances between the spacers 150 and 190, in accordance with some embodiments. The difference may be due to manufacturing processes.

As shown in FIGS. 1N, 1N-1, and 1N-2, the layer 130, which is not covered by the spacers 150 and 190, is removed, in accordance with some embodiments. After the removal process, the pattern of the spacers 150 and 190 is substantially transferred to the layer 130, in accordance with some embodiments.

The removal process includes an etching process, such as a dry etching process, in accordance with some embodiments. In some embodiments, the spacers 150 and 190 are removed during the removal process. In some other embodiments, the spacers 150 and 190 are removed after the removal process.

As shown in FIGS. 1O, 1O-1, and 1O-2, the layer 120, which is not covered by the layer 130, is removed, in accordance with some embodiments. After the removal process, the pattern of the layer 130 is substantially transferred to the layer 120, in accordance with some embodiments. The removal process includes an etching process, such as a dry etching process, in accordance with some embodiments. In some embodiments, the layer 130 is removed during the removal process. In some other embodiments, the layer 130 is removed after the removal process.

The processes of FIGS. 1A-1O may be used to form devices over or in the substrate 110. The devices include active devices and/or passive devices. The devices include conductive lines, dielectric layers, or any suitable device.

Figure 2A:
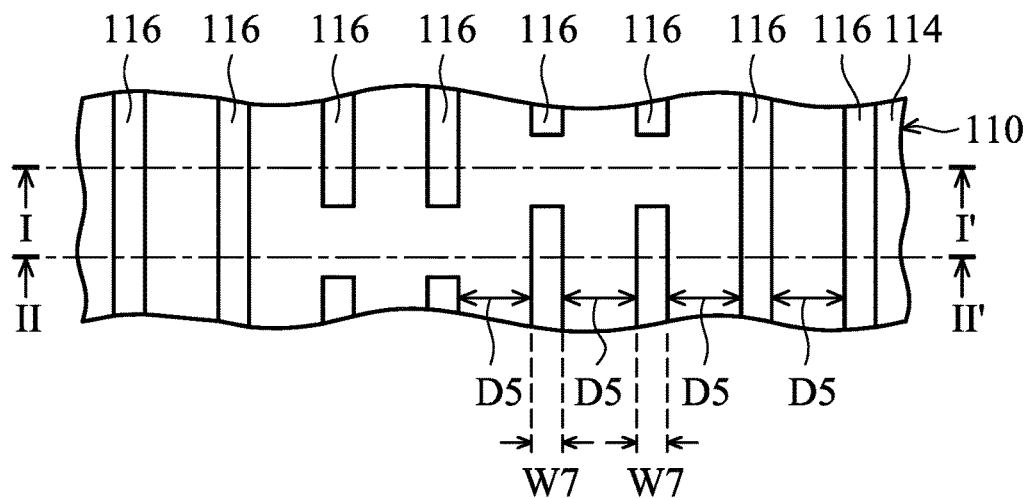
FIG. 2A is a top view of a semiconductor device structure, in accordance with some embodiments.
Figure 2B:
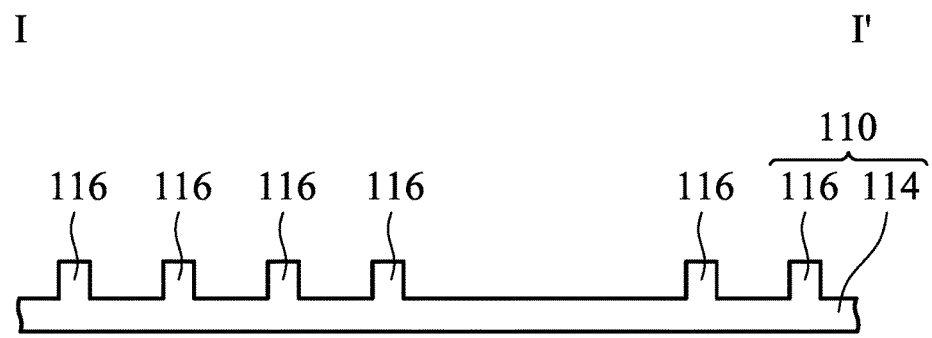
FIG. 2B is a cross-sectional view illustrating the semiconductor device structure along a sectional line I-I' in FIG. 2A, in accordance with some embodiments.
Figure 2C:
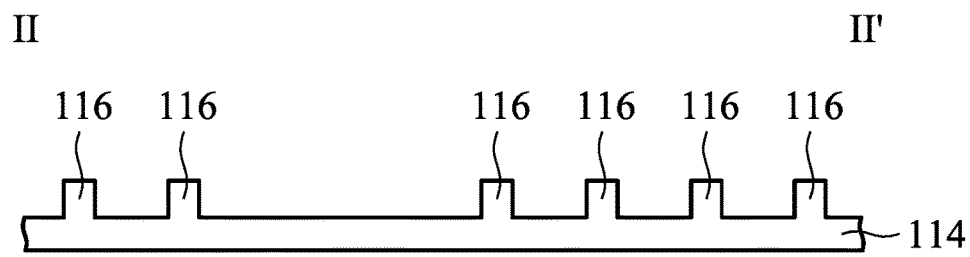
FIG. 2C is a cross-sectional view illustrating the semiconductor device structure along a sectional line II-II' in FIG. 2A, in accordance with some embodiments.

FIG. 2A is a top view of a semiconductor device structure, in accordance with some embodiments. FIG. 2B is a cross-sectional view illustrating the semiconductor device structure along a sectional line I-I' in FIG. 2A, in accordance with some embodiments. FIG. 2C is a cross-sectional view illustrating the semiconductor device structure along a sectional line II-II' in FIG. 2A, in accordance with some embodiments.

After the step of FIG. 1O, as shown in FIGS. 2A, 2B, and 2C, a portion of the substrate 110, which is not covered by the layer 120, is removed, in accordance with some embodiments. After the removal process, the pattern of the layer 120 is substantially transferred to the substrate 110, in accordance with some embodiments. The removal process includes an etching process, such as a dry etching process, in accordance with some embodiments. In some embodiments, the layer 120 is removed during the removal process. In some other embodiments, the layer 120 is removed after the removal process.

After the removal process, the substrate 110 has a base portion 114 and fin portions 116, in accordance with some embodiments. The fin portions 116 are over the base portion 114, in accordance with some embodiments. The fin portions 116 are spaced apart from each other by substantially the same distance D5, in accordance with some embodiments. The fin portions 116 are substantially parallel to each other, in accordance with some embodiments. The term "substantially parallel" in the application may include small deviations from parallel geometries. The deviations may be due to manufacturing processes. The fin portions 116 have substantially the same width W7, in accordance with some embodiments.

Figure 3A:
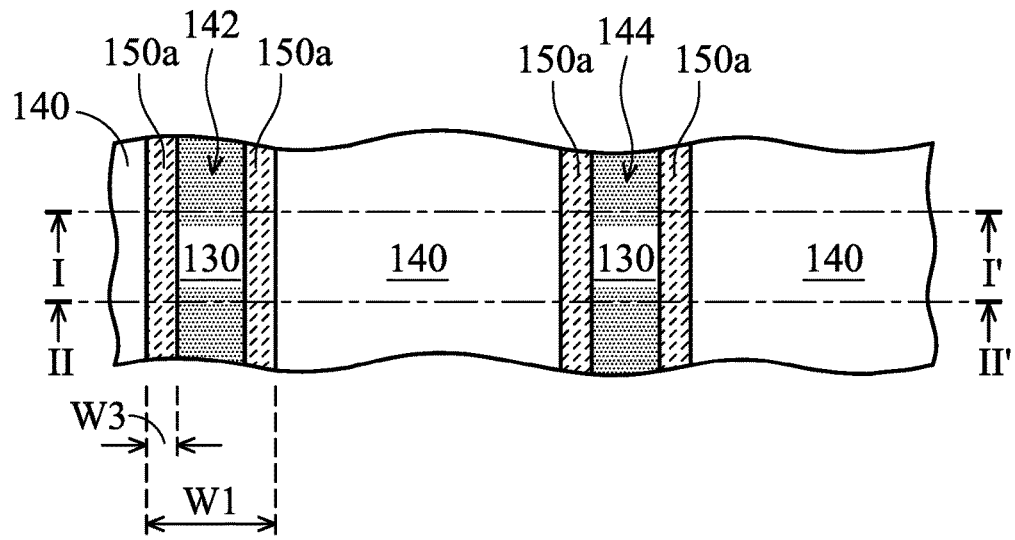
FIGS. 3A-3F are top views of various stages of a process for forming a semiconductor device structure, in accordance with some embodiments.
Figures 1, 3A:
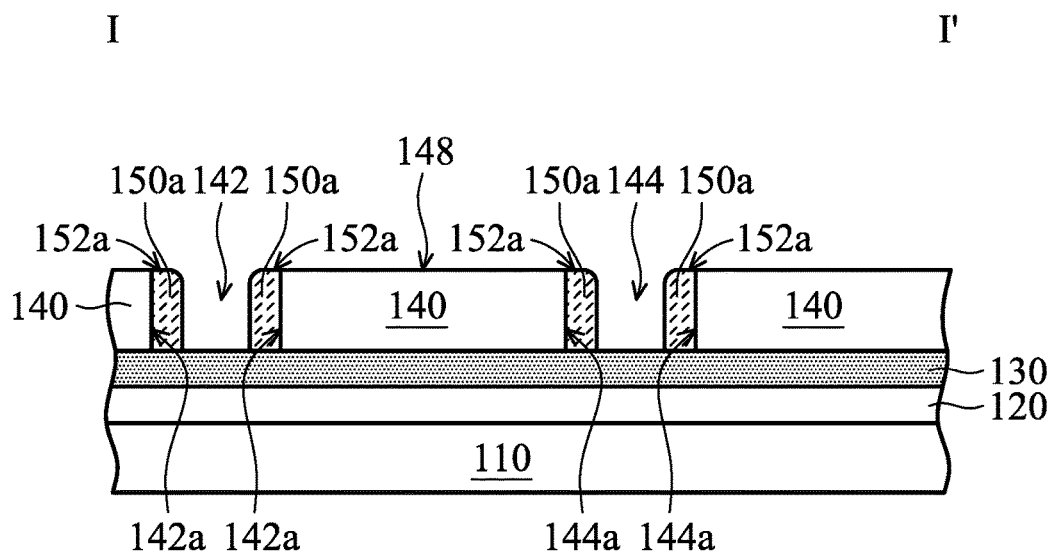
Figures 2, 3A:
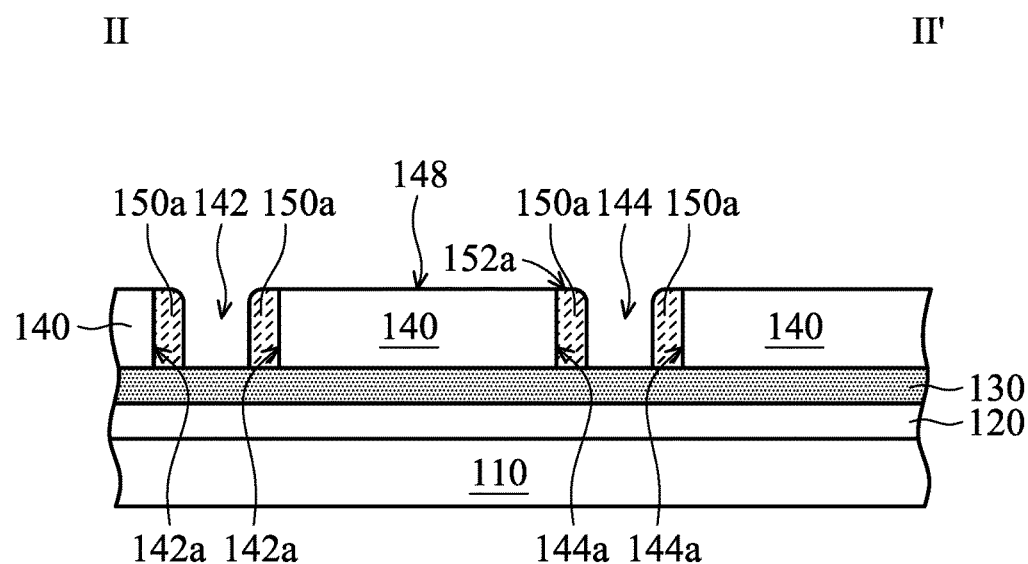
Figure 3B:
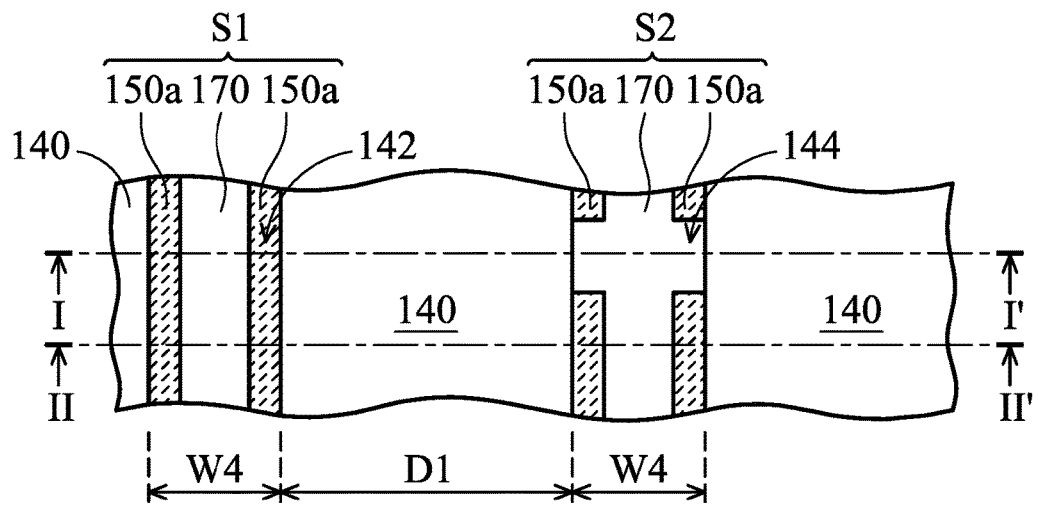
Figures 1, 3B:
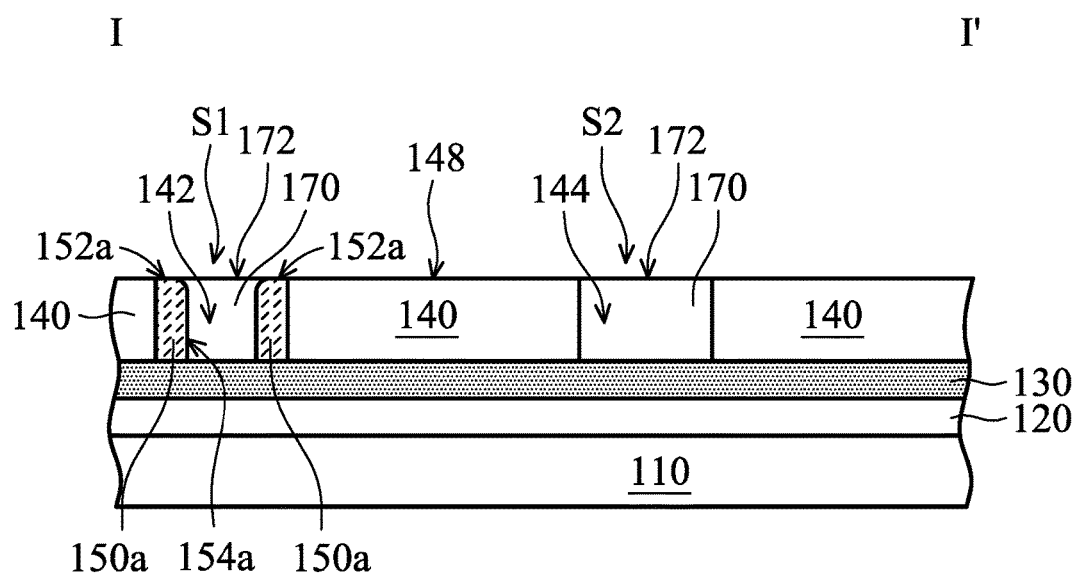
Figures 2, 3B:
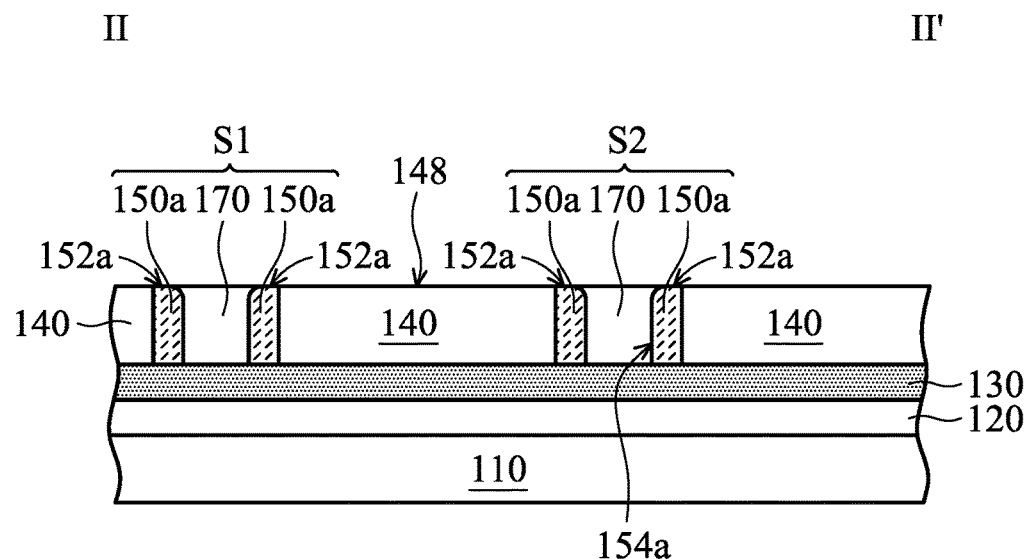
Figure 3C:
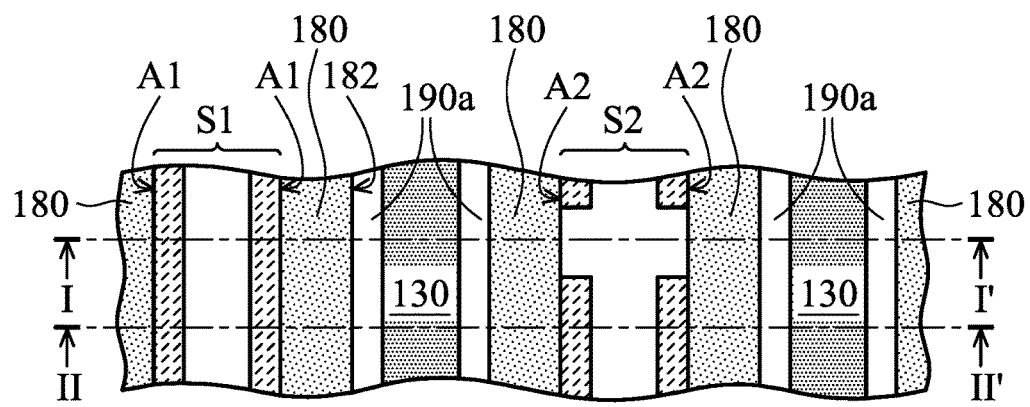
Figures 1, 3C:
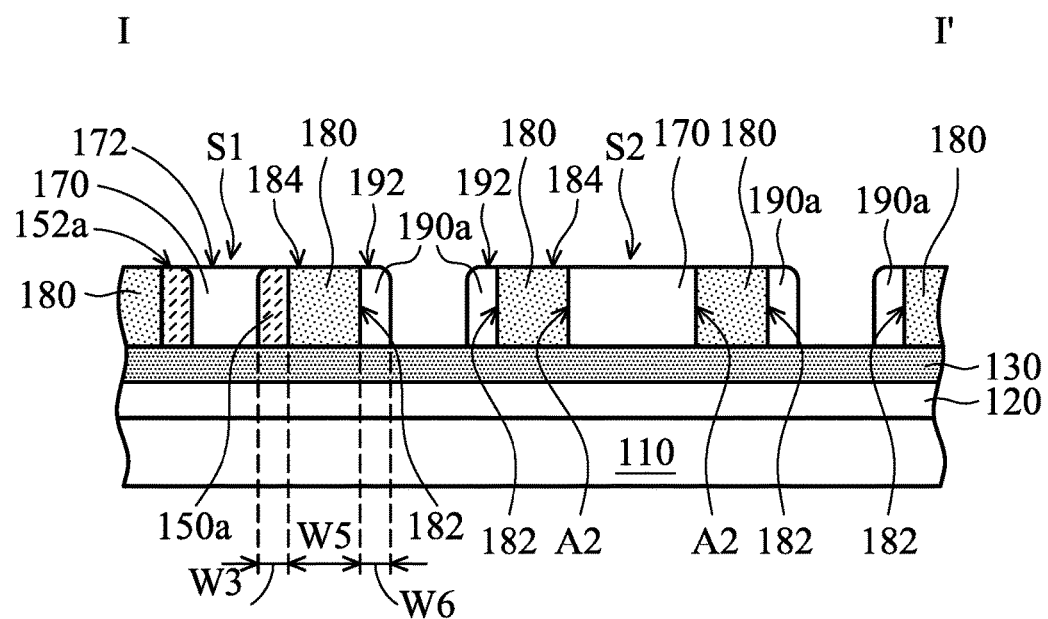
Figures 2, 3C:
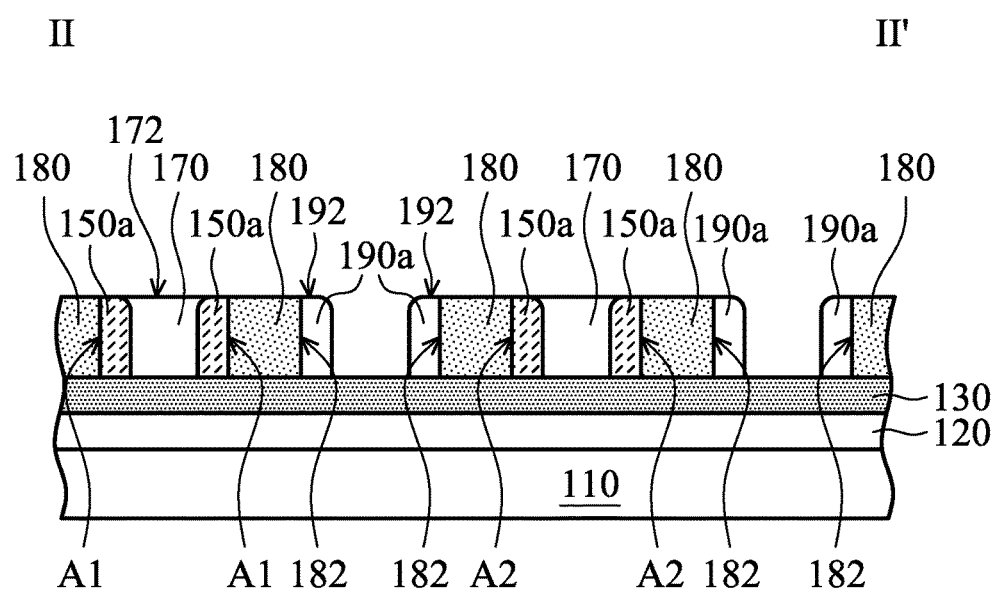
Figure 3D:
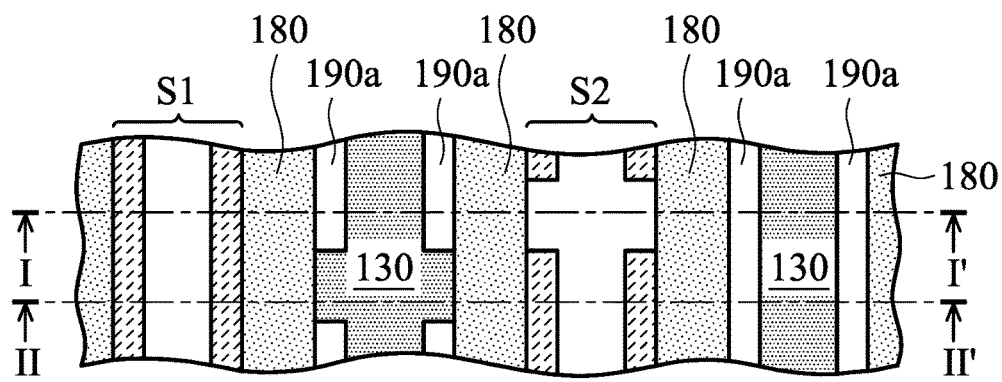
Figures 1, 3D:
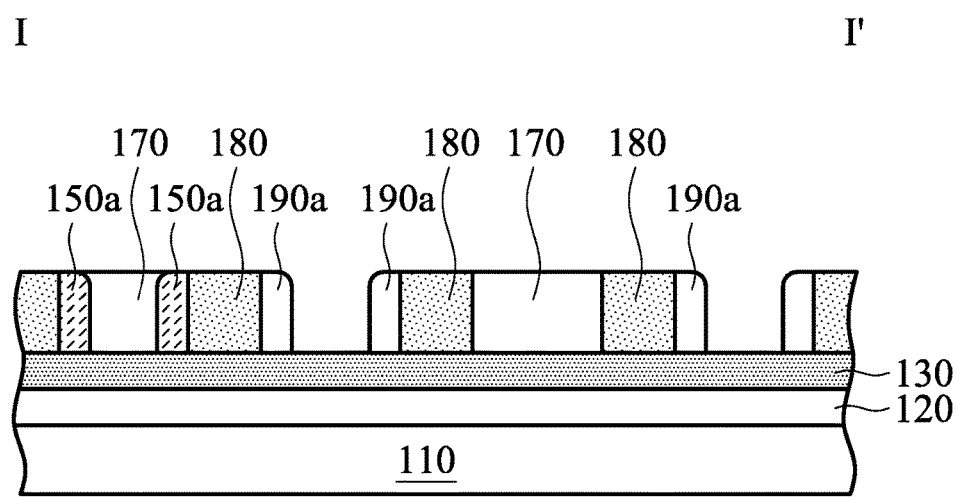
Figures 2, 3D:
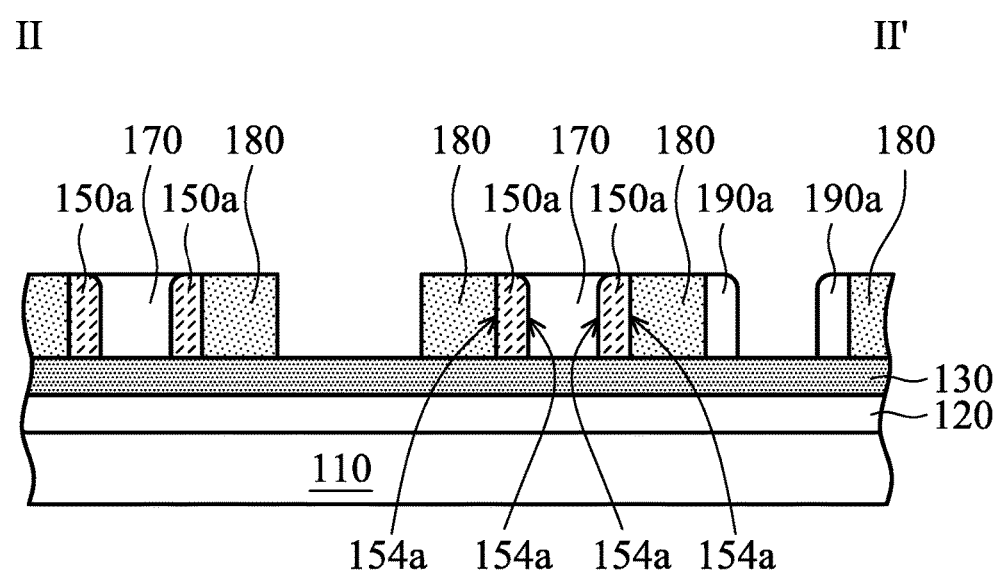
Figure 3E:
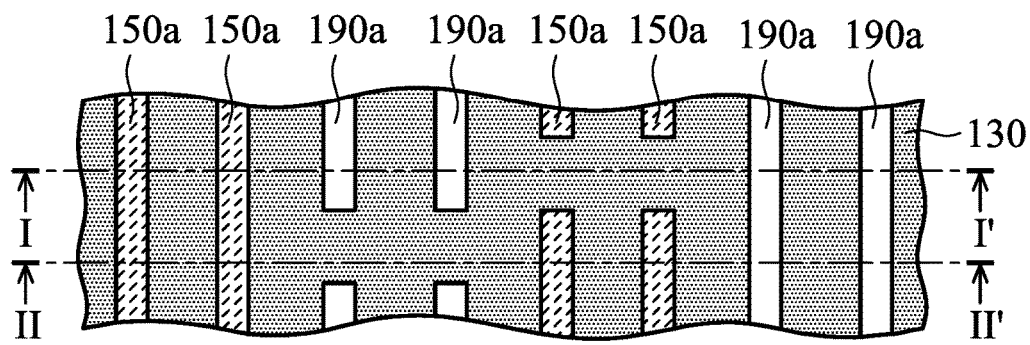
Figures 1, 3E:
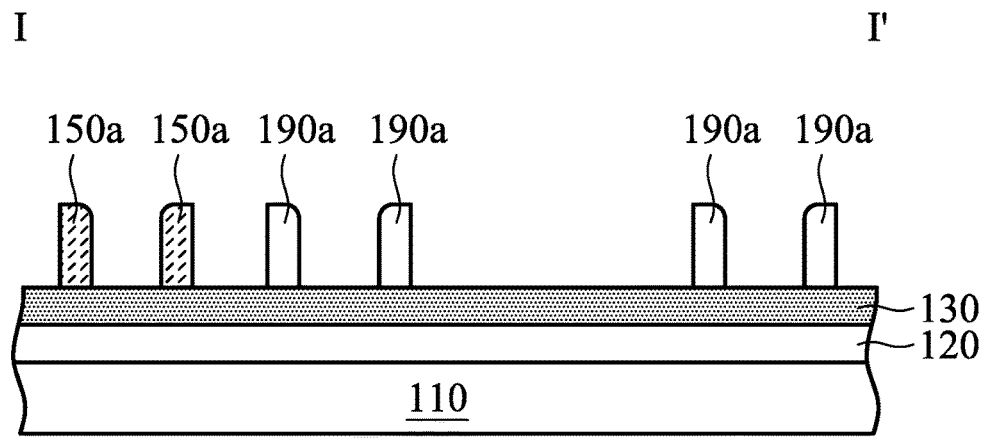
Figures 2, 3E:
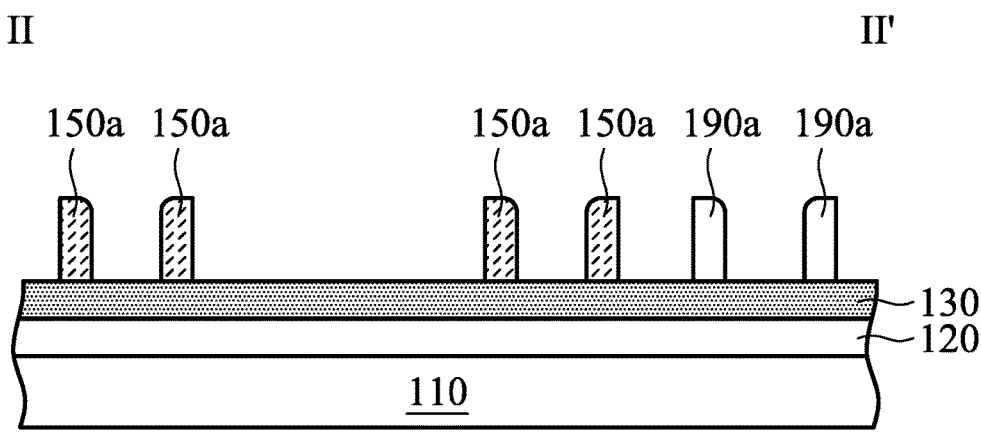
Figure 3F:
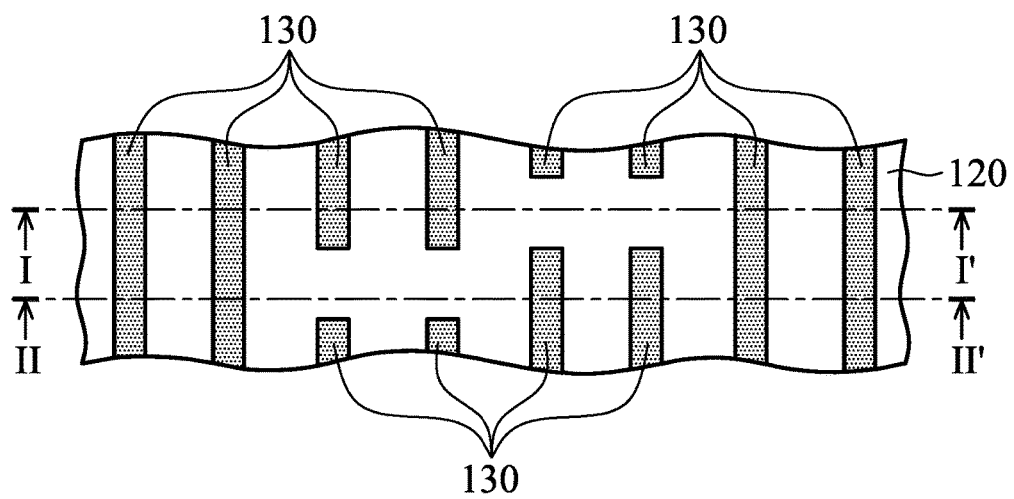
Figures 1, 3F:
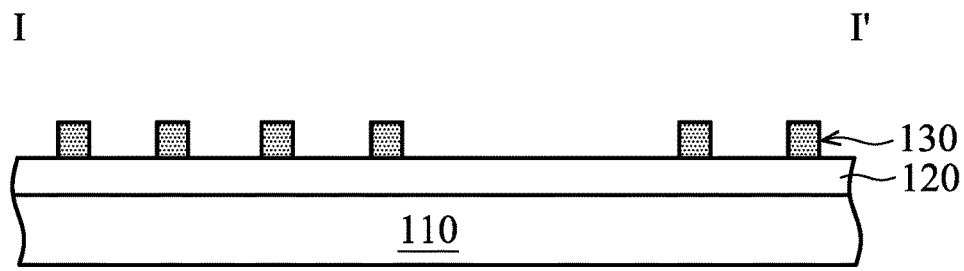
Figures 2, 3F:
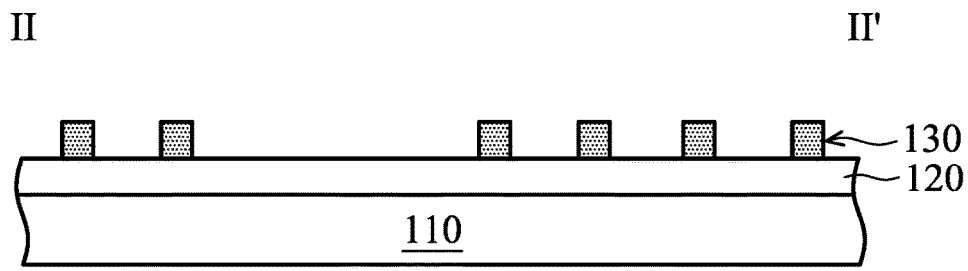

FIGS. 3A-3F are top views of various stages of a process for forming a semiconductor device structure, in accordance with some embodiments. FIGS. 3A-1 to 3F-1 are cross-sectional views illustrating the semiconductor device structure along sectional lines I-I' in FIGS. 3A-3F, in accordance with some embodiments. FIGS. 3A-2 to 3F-2 are cross-sectional views illustrating the semiconductor device structure along sectional lines II-II' in FIGS. 3A-3F, in accordance with some embodiments.

As shown in FIGS. 3A, 3A-1, and 3A-2, after the step of FIG. 1A, spacers 150a are formed over the inner walls 142a and 144a of the trenches 142 and 144, in accordance with some embodiments. Each spacer 150a has a top surface 152a, in accordance with some embodiments. The layer 140 has a top surface 148, in accordance with some embodiments. The top surface 152a is substantially aligned with (or coplanar with) the top surface 148, in accordance with some embodiments.

The spacers 150a and the layers 130 and 140 are made of different materials, in accordance with some embodiments. The spacers 150a are made of an insulating material or a conductive material, in accordance with some embodiments. The insulating material includes silicon nitride, silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof.

The conductive material includes metal, such as copper, aluminum, tungsten, gold, silver, or a combination thereof, in accordance with some embodiments. The spacers 150a are formed using a deposition process (e.g., a chemical vapor deposition process or a physical vapor deposition process) and an anisotropic etching process (e.g., a dry etching process), in accordance with some embodiments. The spacers 150a have substantially the same width W3, in accordance with some embodiments. The width W3 is less than the width W1 of the trench 142 or 144, in accordance with some embodiments.

Thereafter, as shown in FIGS. 3B, 3B-1, and 3B-2, processes of FIGS. 1C-1E are performed, in accordance with some embodiments. As shown in FIGS. 3B, 3B-1, and 3B-2, a filling layer 170 is filled into the trenches 142 and 144 to cover sidewalls 154a of the spacers 150a, in accordance with some embodiments.

The filling layer 170 and the spacers 150a in the trench 142 together form a strip structure S1, in accordance with some embodiments. The filling layer 170 and the spacers 150a in the trench 144 together form a strip structure S2, in accordance with some embodiments.

The strip structures S1 and S2 have substantially the same width W4, in accordance with some embodiments. The width W4 is less than a distance D1 between the strip structures S1 and S2, in accordance with some embodiments. As shown in FIG. 3B, the strip structures S1 and S2 are substantially parallel to each other, in accordance with some embodiments.

The filling layer 170 is made of a material that is different from the materials of the layers 130 and 140 and the spacers 150a, in accordance with some embodiments. The filling layer 170 is made of an insulating material, in accordance with some embodiments. The insulating material includes silicon oxide, silicon nitride, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof. The filling layer 170 is formed using a spin coating process and a chemical mechanical polishing process, in accordance with some embodiments.

In some other embodiments, the filling layer 170 is made of a conductive material, in accordance with some embodiments. The conductive material includes metal, such as copper, aluminum, tungsten, gold, silver, or a combination thereof, in accordance with some embodiments. The filling layer 170 is formed using a deposition process and a chemical mechanical polishing process, in accordance with some embodiments. In some embodiments, the top surfaces 152a of the spacers 150a, a top surface 172 of the filling layer 170 and the top surface 148 of the layer 140 are substantially aligned with each other (or substantially coplanar with each other).

Afterwards, as shown in FIGS. 3C, 3C-1, and 3C-2, processes of FIGS. 1G-1H are performed, in accordance with some embodiments. As shown in FIGS. 3C, 3C-1, and 3C-2, spacers 190a are formed over sidewalls 182 of the spacers 180, in accordance with some embodiments. The spacers 190a have substantially the same width W6, in accordance with some embodiments.

In some embodiments, the width W6 is different from the width W3 of the spacer 150a. In some other embodiments, the width W6 is substantially equal to the width W3 of the spacer 150a. The width W3 or W6 is less than the width W5 of the spacer 180, in accordance with some embodiments.

Each spacer 190a has a top surface 192, in accordance with some embodiments. Each spacer 180 has a top surface 184, in accordance with some embodiments. The top surface 152a, 172, 184 and 192 are substantially aligned with (or substantially coplanar with) each other, in accordance with some embodiments.

In some embodiments, the spacers 150a and 190a are made of different materials. In some embodiments, the filling layer 170 is made of a material that is different from the materials of the spacers 150a and 190a. In some embodiments, the spacers 180 are made of a material that is different from the materials of the spacers 150a and 190a and the filling layer 170.

The spacers 190a are made of an insulating material or a conductive material, in accordance with some embodiments. The insulating material includes silicon nitride, silicon oxide, silicon oxynitride, a low dielectric constant (low-k) material, an extreme low-k (ELK) material, borosilicate glass (BSG), phosphoric silicate glass (PSG), borophosphosilicate glass (BPSG), fluorinated silicate glass (FSG), a polymer material, one or more other suitable materials, or a combination thereof.

The conductive material includes metal, such as copper, aluminum, tungsten, gold, silver, or a combination thereof, in accordance with some embodiments. The spacers 190a are formed using a deposition process (e.g., a chemical vapor deposition process or a physical vapor deposition process) and an anisotropic etching process (e.g., a dry etching process), in accordance with some embodiments.

As shown in FIGS. 3D, 3D-1, and 3D-2, processes of FIGS. 1J-1L are performed to remove portions of the spacers 190a, in accordance with some embodiments. Since the spacers 150a and 190a are made of different materials to increase the etching selectivity between the spacers 150a and 190a, the spacers 150a are prevented from damage during the removal process for removing the portions of the spacers 190, in accordance with some embodiments. Furthermore, the filling layer 170 and the spacers 180 covering the sidewalls 154a of the spacers 150a protect the spacers 150a from damage during the removal process for removing the portions of the spacers 190, in accordance with some embodiments.

As shown in FIGS. 3E, 3E-1, and 3E-2, the filling layer 170 and the spacers 180 are removed, in accordance with some embodiments. The filling layer 170 is removed using an etching process, such as a wet etching process using a $NH_4OH$ solution, in accordance with some embodiments.

The spacers 180 are removed using an etching process, such as a wet etching process using a HF solution, in accordance with some embodiments. In some embodiments, the filling layer 170 is removed first, and then the spacers 180 are removed. In some other embodiments, the spacers 180 are removed first, and then the filling layer 170 is removed.

As shown in FIGS. 3F, 3F-1, and 3F-2, the layer 130, which is not covered by the spacers 150a and 190a, is removed, in accordance with some embodiments. After the removal process, the pattern of the spacers 150a and 190a is substantially transferred to the layer 130, in accordance with some embodiments. The removal process includes an etching process, such as a dry etching process, in accordance with some embodiments.

In some embodiments, the spacers 150a and 190a are removed during the removal process. In some other embodiments, the spacers 150a and 190a are removed after the removal process. Thereafter, processes of FIGS. 1O and/or 2A are performed, in accordance with some embodiments.

In accordance with some embodiments, methods for forming semiconductor device structures are provided. The methods (for forming the semiconductor device structure) remove a portion of first spacers and then form second spacers between first spacers. Therefore, the removal process of the portion of first spacers does not damage the second spacers. The methods include form a filling layer covering the first spacers after the removal process of the portion of the first spacers and before the formation of the second spacers; and removing a portion of the second spacers after the formation of the second spacers. The filling layer protects the first spacers from damage during the removal process of the portion of the second spacers.

In accordance with some embodiments, a method for forming a semiconductor device structure is provided. The method includes forming a first layer over a substrate. The first layer has a trench. The method includes forming first spacers over inner walls of the trench. The method includes removing a portion of the first spacers. The method includes forming a filling layer into the trench to cover the first spacers. The filling layer and the first spacers together form a strip structure. The method includes removing the first layer. The method includes forming second spacers over two opposite first sidewalls of the strip structure. The method includes forming third spacers over second sidewalls of the second spacers. The method includes removing the filling layer and the second spacers.

In accordance with some embodiments, a method for forming a semiconductor device structure is provided. The method includes forming a first layer over a substrate. The first layer has a first trench and a second trench. The method includes forming first spacers over first inner walls of the first trench and second inner walls of the second trench. The method includes removing a portion of the first spacers. The method includes forming a filling layer into the first trench and the second trench to cover the first spacers. The filling layer and the first spacers in the first trench together form a first strip structure, the filling layer and the first spacers in the second trench together form a second strip structure, and the first strip structure and the second strip structure have a substantially same first width. The method includes removing the first layer. The method includes forming second spacers over two opposite first sidewalls of the first strip structure and two opposite second sidewalls of the second strip structure. The method includes forming third spacers over third sidewalls of the second spacers. The method includes removing a portion of the third spacers. The method includes removing the filling layer and the second spacers.

In accordance with some embodiments, a method for forming a semiconductor device structure is provided. The method includes forming a first layer over a substrate. The first layer has a first trench and a second trench. The method includes forming first spacers over first inner walls of the first trench and second inner walls of the second trench. A first top surface of the first spacer is substantially aligned with a second top surface of the first layer. The method includes removing a portion of the first spacers over the second inner walls. The method includes forming a filling layer into the first trench and the second trench. The filling layer and the first spacers in the first trench together form a first strip structure, and the filling layer and the first spacers in the second trench together form a second strip structure. The method includes removing the first layer. The method includes forming second spacers over two opposite first sidewalls of the first strip structure and two opposite second sidewalls of the second strip structure. The method includes forming third spacers over third sidewalls of the second spacers. The first spacers and the third spacers are made of different materials. The method includes removing a portion of the third spacers. The method includes removing the filling layer and the second spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first layer over a substrate, wherein the first layer has a trench;
    forming first spacers over inner walls of the trench;
    removing a portion of the first spacers;
    forming a filling layer into the trench to cover the first spacers, wherein the filling layer and the first spacers together form a strip structure;
    removing the first layer;
    forming second spacers over two opposite first sidewalls of the strip structure;
    forming third spacers over second sidewalls of the second spacers; and
    removing the filling layer and the second spacers.

2. The method for forming the semiconductor device structure as claimed in claim 1, further comprising:
    removing a portion of the third spacers after forming the third spacers over the second sidewalls and before removing the filling layer and the second spacers.

3. The method for forming the semiconductor device structure as claimed in claim 2, wherein the filling layer covers top surfaces of the first spacers.

4. The method for forming the semiconductor device structure as claimed in claim 3, wherein the first spacers and the third spacers are made of a same first material, the filling layer is made of a second material, and the second material is different from the first material.

5. The method for forming the semiconductor device structure as claimed in claim 4, wherein a first maximum height of the first spacer relative to the substrate is less than a second maximum height of the second spacer relative to the substrate, and a third maximum height of the third spacer relative to the substrate is less than the second maximum height.

6. The method for forming the semiconductor device structure as claimed in claim 1, wherein two adjacent first spacers are spaced apart by a first distance, the first spacer and the third spacer are spaced apart by a second distance, and the first distance is substantially equal to the second distance.

7. The method for forming the semiconductor device structure as claimed in claim 1, wherein the filling layer and the second spacers are made of different materials.

8. The method for forming the semiconductor device structure as claimed in claim 1, wherein the first spacers and the third spacers have a substantially same first width, the second spacers have a substantially same second width, and the first width is less than the second width.

9. The method for forming the semiconductor device structure as claimed in claim 1, further comprising:
    forming a second layer over the substrate before forming the first layer, wherein the first layer is formed over the second layer; and
    removing the second layer which is not covered by the first spacers and the third spacers after removing the filling layer and the second spacers.

10. The method for forming the semiconductor device structure as claimed in claim 1, wherein the first layer is divided into a first strip portion and a second strip portion by the trench, and the first strip portion and the second strip portion are substantially parallel to each other.

11. A method for forming a semiconductor device structure, comprising:
    forming a first layer over a substrate, wherein the first layer has a first trench and a second trench;
    forming first spacers over first inner walls of the first trench and second inner walls of the second trench;
    removing a portion of the first spacers;
    forming a filling layer into the first trench and the second trench to cover the first spacers, wherein the filling layer and the first spacers in the first trench together form a first strip structure, the filling layer and the first spacers in the second trench together form a second strip structure, and the first strip structure and the second strip structure have a substantially same first width;
    removing the first layer;
    forming second spacers over two opposite first sidewalls of the first strip structure and two opposite second sidewalls of the second strip structure;
    forming third spacers over third sidewalls of the second spacers;
    removing a portion of the third spacers; and
    removing the filling layer and the second spacers.

12. The method for forming the semiconductor device structure as claimed in claim 11, wherein the first width is less than a distance between the first strip structure and the second strip structure.

13. The method for forming the semiconductor device structure as claimed in claim 11, wherein the second spacers have a substantially same second width, and the first width is greater than the second width.

14. The method for forming the semiconductor device structure as claimed in claim 13, wherein the third spacers have a substantially same third width, and the second width is greater than the third width.

15. The method for forming the semiconductor device structure as claimed in claim 14, wherein the first spacers have a substantially same fourth width, and the second width is greater than the fourth width.

16. A method for forming a semiconductor device structure, comprising:
  forming a first layer over a substrate, wherein the first layer has a first trench and a second trench;
  forming first spacers over first inner walls of the first trench and second inner walls of the second trench, wherein a first top surface of the first spacer is substantially aligned with a second top surface of the first layer;
  removing a portion of the first spacers;
  forming a filling layer into the first trench and the second trench, wherein the filling layer and the first spacers in the first trench together form a first strip structure, and the filling layer and the first spacers in the second trench together form a second strip structure;
  removing the first layer;
  forming second spacers over two opposite first sidewalls of the first strip structure and two opposite second sidewalls of the second strip structure;
  forming third spacers over third sidewalls of the second spacers, wherein the first spacers and the third spacers are made of different materials;
  removing a portion of the third spacers; and
  removing the filling layer and the second spacers.

17. The semiconductor device structure as claimed in claim 16, wherein the first top surface of the first spacer, a third top surface of the second spacer, and a fourth top surface of the filling layer are substantially aligned with each other.

18. The semiconductor device structure as claimed in claim 16, wherein the first spacers, the second spacers, and the third spacers are made of different materials.

19. The semiconductor device structure as claimed in claim 16, wherein the filling layer, the first spacers, and the third spacers are made of different materials.

20. The semiconductor device structure as claimed in claim 16, wherein the first strip structure and the second strip structure are substantially parallel to each other.

\* \* \* \* \*